US012249268B2

(12) United States Patent
Kim et al.

(10) Patent No.: US 12,249,268 B2
(45) Date of Patent: Mar. 11, 2025

(54) PIXEL AND DISPLAY DEVICE INCLUDING THE SAME

(71) Applicant: Samsung Display Co., Ltd., Yongin-Si (KR)

(72) Inventors: Sunkwang Kim, Seoul (KR); Kangmoon Jo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 122 days.

(21) Appl. No.: 17/899,382

(22) Filed: Aug. 30, 2022

(65) Prior Publication Data

US 2023/0178004 A1 Jun. 8, 2023

(30) Foreign Application Priority Data

Dec. 7, 2021 (KR) .................. 10-2021-0174038

(51) Int. Cl.
*G09G 3/32* (2016.01)
*G09G 3/3233* (2016.01)
*H01L 25/075* (2006.01)
*H01L 33/50* (2010.01)
*H01L 33/54* (2010.01)
*H01L 33/62* (2010.01)

(52) U.S. Cl.
CPC ............ *G09G 3/32* (2013.01); *G09G 3/3233* (2013.01); *H01L 25/0753* (2013.01); *H01L 33/505* (2013.01); *H01L 33/54* (2013.01); *H01L 33/62* (2013.01); *G09G 2300/0852* (2013.01); *G09G 2310/0275* (2013.01)

(58) Field of Classification Search
CPC ...... G09G 3/32; G09G 3/3225; G09G 3/3233; G09G 2300/0852; G09G 2310/0275; H01L 25/0753; H01L 27/156; H01L 33/44; H01L 33/504; H01L 33/505; H01L 33/507; H01L 33/54; H01L 33/62; H10K 50/844; H10K 59/121; H10K 59/1213; H10K 59/131; H10K 59/30; H10K 59/351; H10K 59/38; H10K 59/878
See application file for complete search history.

(56) References Cited

U.S. PATENT DOCUMENTS

| 10,551,553 | B2 | 2/2020 | Dubrow et al. | |
| 2020/0219935 | A1* | 7/2020 | Ahn | H10K 59/122 |
| 2020/0235173 | A1* | 7/2020 | Nakamura | H10K 59/131 |

(Continued)

*Primary Examiner* — Ryan A Lubit
(74) *Attorney, Agent, or Firm* — Innovation Counsel LLP

(57) ABSTRACT

A pixel includes: first to fourth driving transistors; a first light emitting diode connected to the first driving transistor; a second light emitting diode connected to the second driving transistor and spaced apart from the first light emitting diode in a first direction; a third light emitting diode connected to the third driving transistor and disposed between the first light emitting diode and the second light emitting diode; and a fourth light emitting diode connected to the fourth driving transistor and disposed between the first light emitting diode and the second light emitting diode, wherein a planar area of the first driving transistor is smaller than a planar area of each of the third and fourth driving transistors, a planar area of the second driving transistor is smaller than a planar area of each of the third and fourth driving transistors, and a first data signal is applied to the first and second driving transistors.

22 Claims, 23 Drawing Sheets

(56) References Cited

U.S. PATENT DOCUMENTS

| | | | |
|---|---|---|---|
| 2020/0235174 A1* | 7/2020 | Nakamura | G09F 9/302 |
| 2021/0013367 A1* | 1/2021 | Wu | H01L 33/32 |
| 2021/0202914 A1* | 7/2021 | Kim | H10K 59/121 |
| 2022/0077248 A1* | 3/2022 | Heo | H10K 59/352 |
| 2022/0199718 A1* | 6/2022 | Lee | G09G 3/3258 |
| 2022/0376199 A1* | 11/2022 | Chen | H10K 85/631 |
| 2023/0006015 A1* | 1/2023 | Sun | H10K 59/1213 |
| 2023/0139734 A1* | 5/2023 | Cao | H01L 27/1255 |
| | | | 257/40 |

* cited by examiner

FIG. 3
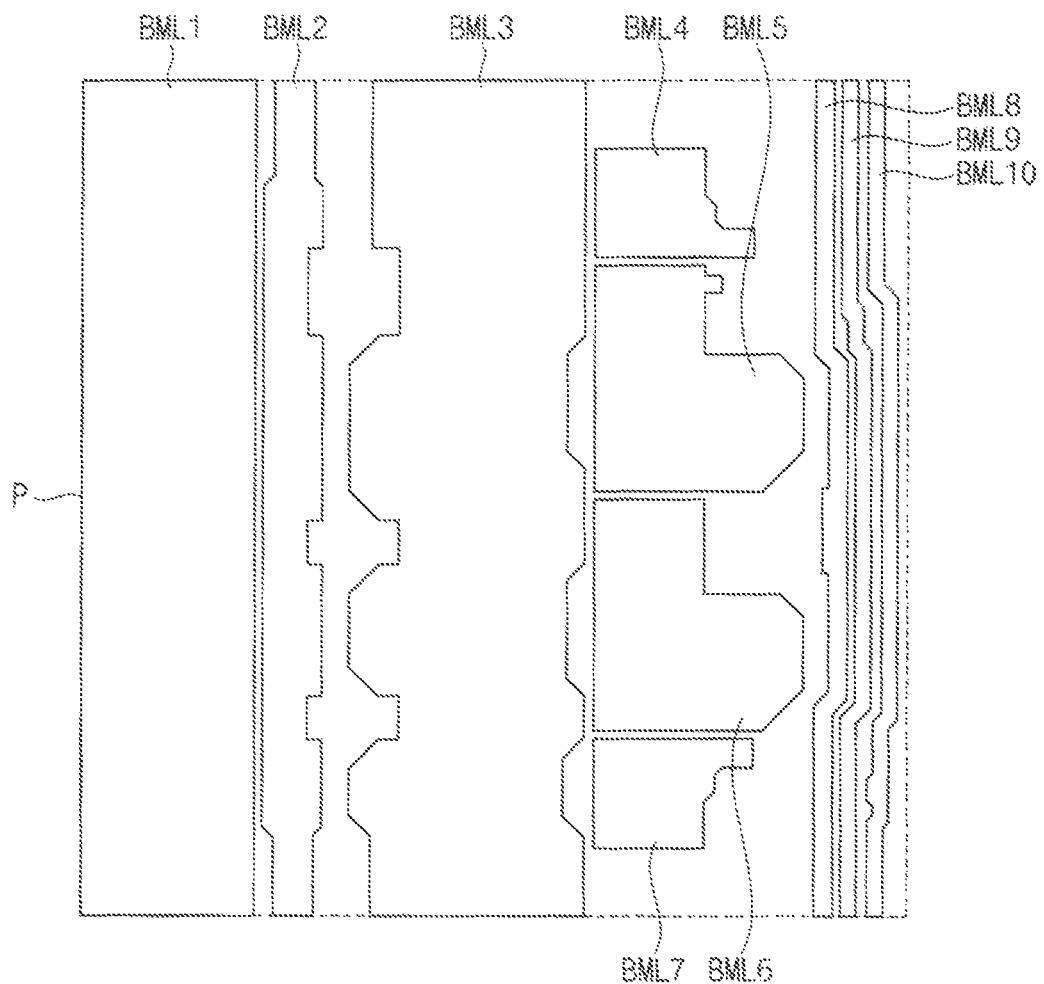

FIG. 8
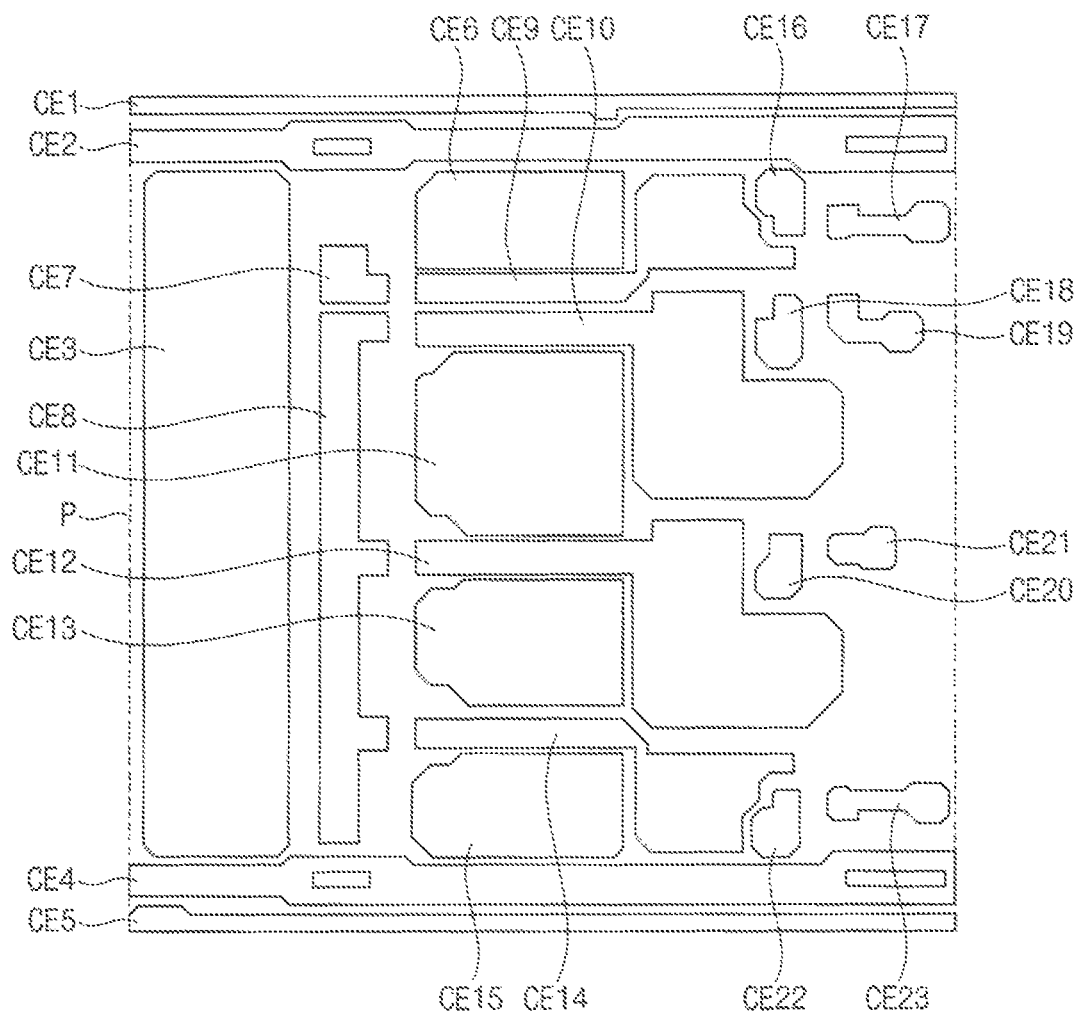
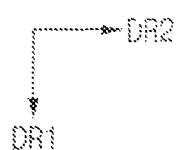

PIXEL AND DISPLAY DEVICE INCLUDING THE SAME

CROSS-REFERENCE TO RELATED APPLICATION

This application claims priority under 35 USC § 119 to Korean Patent Application No. 10-2021-0174038 filed on Dec. 7, 2021, in the Korean Intellectual Property Office (KIPO), the entire disclosure of which is incorporated herein by reference.

BACKGROUND

1. Field

The present inventive concept relates to a pixel and a display device including the same. More specifically, the present inventive concept relates to a pixel capable of emitting light and a display device including the same.

2. Description of the Related Art

A display device may include a pixel to emit light. The pixel may include a driving element and a light emitting diode. The driving element may include a transistor, a capacitor and the like. The light emitting diode may include an organic light emitting diode, an inorganic light emitting diode, or the like. The light emitting diode may be connected to the driving element to receive a signal.

The pixel may include a plurality of sub-pixels. The luminous efficiency of the display device may vary according to the arrangement of the sub-pixels. However, lights emitted from the pixel may be mixed according to the arrangement of the sub-pixels, thereby emitting light having an undesirable color.

Accordingly, various studies on properly arranging sub-pixels are being conducted.

SUMMARY

An object of the present inventive concept is to provide a pixel capable of emitting light.

Another object of the present inventive concept is to provide a display device including pixels capable of emitting light.

However, the object of the present inventive concept is not limited to the above-described objects, and may be variously expanded without departing from the spirit and scope of the present inventive concept.

In order to achieve one object of the above-described present inventive concept, the pixel according to one embodiment of the present inventive concept includes: first to fourth driving transistors; a first light emitting diode connected to the first driving transistor; a second light emitting diode connected to the second driving transistor and spaced apart from the first light emitting diode in a first direction when viewed in a plan view; a third light emitting diode connected to the third driving transistor and disposed between the first light emitting diode and the second light emitting diode when viewed in a plan view; and a fourth light emitting diode connected to the fourth driving transistor and disposed between the first light emitting diode and the second light emitting diode when viewed in a plan view, wherein a planar area of the first driving transistor is smaller than a planar area of each of the third driving transistor and the fourth driving transistor, a planar area of the second driving transistor is smaller than the planar area of each of the third driving transistor and the fourth driving transistor, a first data signal is applied to the first driving transistor and the second driving transistor, a second data signal different from the first data signal is applied to the third driving transistor, and a third data signal different from the first data signal and the second data signal is applied to the fourth driving transistor.

In one embodiment, the planar area of the first driving transistor may be less than or equal to a half of the planar area of each of the third driving transistor and the fourth driving transistor, and the planar area of the second driving transistor may be less than or equal to a half of the planar area of each of the third driving transistor and the fourth driving transistor.

In one embodiment, the planar area of the first light emitting diode may be smaller than the planar area of each of the third light emitting diode and the fourth light emitting diode, and the planar area of the second light emitting diode may be smaller than the planar area of the each of the third light emitting diode and the fourth light emitting diode.

In one embodiment, the planar area of the first light emitting diode may be less than or equal to a half of the planar area of each of the third light emitting diode and the fourth light emitting diode, and the planar area of the second light emitting diode may be less than or equal to a half of the planar area of the each of the third light emitting diode and the fourth light emitting diode.

In one embodiment, the pixel may further include: a first capacitor connected to the first driving transistor, a second capacitor connected to the second driving transistor, a third capacitor connected to the third driving transistor, and a fourth capacitor connected to the fourth driving transistor, wherein the planar area of the first capacitor may be less than or equal to a half of the planar area of each of the third capacitor and the fourth capacitor, and the planar area of the second capacitor may be less than or equal to a half the planar area of the each of the third capacitor and the fourth capacitor.

In one embodiment, the pixel may further include: a first capacitor connected to the first driving transistor, a second capacitor connected to the second driving transistor, a third capacitor connected to the third driving transistor, and a fourth capacitor connected to the fourth driving transistor, wherein the planar area of the first capacitor may be less than or equal to a half of the planar area of each of the third capacitor and the fourth capacitor, and the planar area of the second capacitor may be less than or equal to a half the planar area of the each of the third capacitor and the fourth capacitor.

In one embodiment, when viewed in a planar view, the third light emitting diode and the fourth light emitting diode may be spaced apart from each other in a second direction perpendicular to the first direction.

In one embodiment, the first light emitting diode and the second light emitting diode may partially overlap the third light emitting diode and the fourth light emitting diode in the first direction.

In one embodiment, the first light emitting diode and the second light emitting diode may partially overlap the third light emitting diode and the fourth light emitting diode in the second direction.

In one embodiment, the first light emitting diode and the second light emitting diode may partially overlap the third light emitting diode and the fourth light emitting diode in the first direction and the second direction.

In order to achieve another object of the above-described present inventive concept, the display device according to one embodiment of the present inventive concept includes: a substrate; first to fourth driving transistors; a first light emitting diode connected to the first driving transistor; a second light emitting diode connected to the second driving transistor and spaced apart from the first light emitting diode in a first direction when viewed in a plan view; a third light emitting diode connected to the third driving transistor and disposed between the first light emitting diode and the second light emitting diode when viewed in a plan view; a fourth light emitting diode connected to the fourth driving transistor and disposed between the first light emitting diode and the second light emitting diode when viewed in a plan view; and an encapsulation layer disposed on the first to fourth light emitting diodes to cover the first to fourth light emitting diodes, wherein the planar area of the first driving transistor is smaller than a planar area of each of the third driving transistor and the fourth driving transistor, the planar area of the second driving transistor is smaller than the planar area of the each of the third driving transistor and the fourth driving transistor, a first data signal is applied to the first driving transistor and the second driving transistor, a second data signal different from the first data signal is applied to the third driving transistor, and a third data signal different from the first data signal and the second data signal is applied to the fourth driving transistor.

In one embodiment, the planar area of the first driving transistor may be less than or equal to a half of the planar area of each of the third driving transistor and the fourth driving transistor, and a planar area of the second driving transistor may be less than or equal to a half of the planar area of the each of thy: third driving transistor and the fourth driving transistor.

In one embodiment, the planar area of the first light emitting diode may be smaller than the planar area of each of the third light emitting diode and the fourth light emitting diode, and the planar area of the second light emitting diode may be smaller than the planar area of the each of the third light emitting diode and the fourth light emitting diode.

In one embodiment, the planar area of the first light emitting diode may be less than or equal to a half of the planar area of the each of the third light emitting diode and the fourth light emitting diode, and the planar area of the second light emitting diode may be less than or equal to a half of the planar area of the each of the third light emitting diode and the fourth light emitting diode.

In one embodiment, the display device may further include: a first capacitor connected to the first driving transistor, a second capacitor connected to the second driving transistor, a third capacitor connected to the third driving transistor, and a fourth capacitor connected to the fourth driving transistor, wherein the planar area of the first capacitor may be less than or equal to a half of the planar area of each of the third capacitor and the fourth capacitor, and the planar area of the second capacitor may be less than or equal to a half of the planar area of the each of the third capacitor and the fourth capacitor.

In one embodiment, the display device may further include: a first capacitor connected to the first driving transistor, a second capacitor connected to the second driving transistor, a third capacitor connected to the third driving transistor, and a fourth capacitor connected to the fourth driving transistor, wherein the planar area of the first capacitor may be less than or equal to a half of the planar area of each of the third capacitor and the fourth capacitor, and the planar area of the second capacitor may be less than or equal to a half of the planar area of the each of the third capacitor and the fourth capacitor.

In one embodiment, when viewed in a planar view, the third light emitting diode and the fourth light emitting diode may be spaced apart from each other in a second direction perpendicular to the first direction.

In one embodiment, the first light emitting diode and the second light emitting diode may partially overlap the third light emitting diode and the fourth light emitting diode in the first direction.

In one embodiment, the first light emitting diode and the second light emitting diode may partially overlap the third light emitting diode and the fourth light emitting diode in the second direction.

In one embodiment, the first light emitting diode and the second light emitting diode may partially overlap the third light emitting diode and the fourth light emitting diode in the first direction and the second direction.

In one embodiment, the display device may further include: a first color conversion layer disposed on the first light emitting diode to overlap the first light emitting diode and converting light emitted from the first light emitting diode into first light having a first color, a second color conversion layer disposed on the second light emitting diode to overlap the second light emitting diode and converting light emitted from the second light emitting diode into second light having the first color, a third color conversion layer disposed on the third light emitting diode to overlap the third light emitting diode and converting light emitted from the third light emitting diode into third light having a second color different from the first color, and a light transmitting layer disposed on the fourth light emitting diode to overlap the fourth light emitting diode and transmitting light emitted from the fourth light emitting diode.

In one embodiment, the display device may further include: a first color filter disposed on the first color conversion layer and the second color conversion layer to overlap each of the first color conversion layer and the second color conversion layer, a second color filter disposed on the third color conversion layer to overlap the third color conversion layer, and a third color filter disposed on the light transmitting layer to overlap the light transmitting layer.

The display device according to the embodiments of the present inventive concept may include a pixel. The pixel may include a plurality of sub-pixels, Each of the sub-pixels may include light emitting diodes and driving elements. Light emitting diodes emitting green light may be arranged separately in the first direction, and light emitting, diodes emitting red light and light emitting diodes emitting blue light may be spaced apart in the second direction intersecting the first direction, so that color mixing can be prevented from occurring at both ends of the display device in the first direction.

In addition, in order to separately arrange the sub-pixels emitting, green light, each of the sub-pixels emitting green light may have a size smaller than size of each of the sub-pixel emitting blue light and the sub-pixel emitting red light.

In addition, the sub-pixels emitting green light can be driven by separate driving elements, respectively.

However, the effect according to the present inventive concept is not limited to the above-described effects, and may be variously expanded without departing from the spirit and scope of the present inventive concept.

BRIEF DESCRIPTION OF THE DRAWINGS

FIGS. 3, 4, 5, 6, 7, 8, 9, 10 and 11 are layout diagrams showing one embodiment of the pixel included in the display device of FIG. 1.

FIG. 1S is a sectional view schematically showing still another embodiment taken along the line I-I' of FIG. 1.

DETAILED DESCRIPTION OF THE EMBODIMENTS

Figure 1:
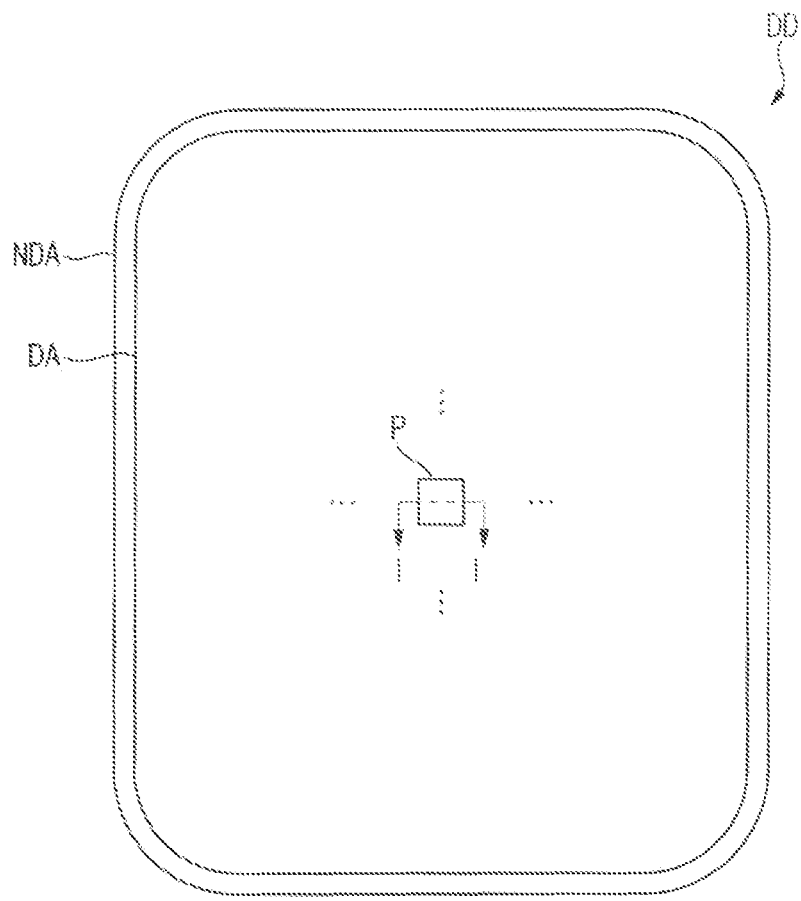
FIG. 1 is a plan view showing one embodiment of a display device.

Hereinafter, the embodiments of the present inventive concept will be described in more detail with reference to the accompanying drawings. The same reference numerals are used for the same components in the drawings, and redundant descriptions of the same components will be omitted.

FIG. 1 is a plan view showing one embodiment of a display device.

Referring to FIG. 1, the display device DD may include a display region DA and a non-display region NDA. The display device DD may display an image in the display region DA. To this end, a plurality of pixels P may be disposed in the display region DA. The pixels P may be disposed over the whole of the display region DA, For example, the pixels P may be generally disposed over the whole of the display region DA in a matrix form. Each of the pixels P may include a plurality of sub-pixels. Each of the sub-pixels may include a driving element and a light emitting diode. The light emitting diode may be connected to the driving element to receive a signal from the driving element. The light emitting diode may emit light in response to the signal. The driving element may include a transistor, a capacitor and the like. The light emitting diode may be an organic light emitting diode or an inorganic light emitting diode.

The display device DD may include a plurality of drivers. The drivers may include a gate driver, a data driver, a light emitting signal generator, a power supply voltage generator, and the like. The drivers may be disposed in the non-display region NDA. The drivers may be electrically connected to the pixels P. The drivers may transmit a signal to the pixels P so that the pixels P may emit light.

Figure 2:
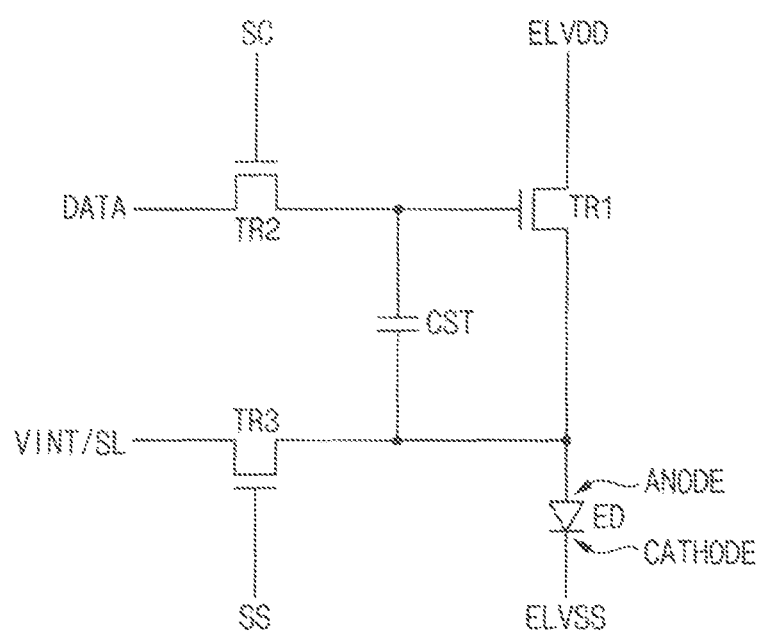
FIG. 2 is a circuit diagram showing one embodiment of a pixel included in the display device of FIG. 1.

FIG. 2 is a circuit diagram showing one embodiment of a pixel included in the display device of FIG. 1. FIG. 2 may be a circuit diagram showing one sub-pixel included in the pixel P of FIG. 1.

Referring to FIG. 2, one sub-pixel may include first to third transistors TR1, TR2 and TR3, a capacitor CST, and a light emitting diode ED.

The first transistor TR1 may include a first terminal, a second terminal and a gate terminal. The first terminal of the first transistor TR1 may be connected to a high power supply voltage ELVDD, the second terminal of the first transistor TR1 may be connected to an anode terminal ANODE of the light emitting diode ED, and a data signal DATA may be applied to the gate terminal of the first transistor TR1. According to an on/off state of the first transistor TR1, the high power supply voltage ELVDD may or may not be transmitted to the anode terminal ANODE of the light emitting diode ED, For example, the first transistor TR1 may be defined as a driving transistor.

The second transistor TR2 may include a first terminal, a second terminal and a gate terminal. The data signal DATA may be applied to the first terminal of the second transistor TR2, the second terminal of the second transistor TR2 may be connected to a first electrode of the capacitor CST and the gate terminal of the first transistor TR1, and a second scan signal SC may be applied to the gate terminal of the second transistor TR2. According to an on/off-state of the second transistor 12, the on/off-state of the first transistor TR1 may be determined. For example, the second transistor TR2 may be defined as a switching transistor.

The third transistor TR3 may include a first terminal, a second terminal and a gate terminal. A sensing signal SL or an initialization voltage VINT may be applied to the first terminal of the third transistor TR3, the second terminal of the third transistor TR3 may be connected to a second electrode of the capacitor CST and the anode terminal ANODE of the light emitting diode ED, and a first scan signal SS may be applied to the gate terminal of the third transistor TR3. For example, the third transistor TR3 may be defined as an initialization transistor.

The anode terminal ANODE of the light emitting diode ED may be connected to the high power supply voltage ELVDD via the first transistor TR1, the cathode terminal CATHODE of the light emitting diode ED may be connected to a low power supply voltage EVLSS, and the light emitting diode ED may emit light based on a potential difference between the high power supply voltage ELVDD and the low power supply voltage EVLSS.

FIGS. 3 to 11 are layout diagrams showing one embodiment of the pixel included in the display device of FIG. 1.

Referring to FIGS. 1 and 3, the display device DD may include first conductive layer. The first conductive layer may include metal, metal oxide, metal nitride, and the like. Examples of the metal may include silver, molybdenum, aluminum, tungsten (W), copper (Cu), nickel (Ni), chromium (Cr), titanium (Ti), tantalum (Ta), platinum (Pt), and scandium (Sc), These may be used individually or in combination. Examples of the metal oxide may include indium tin oxide (ITO), and indium zinc oxide (WO). These may be used individually or in combination. Examples of the metal nitride may include aluminum nitride (AlN), tungsten nitride (WN), and chromium nitride (CrN). These may be used individually or in combination.

The first conductive layer may include a first lower conductive pattern BML1, a, second lower conductive pattern BML2, a third lower conductive pattern BML3, a fourth lower conductive pattern BML4, a fifth lower conductive pattern BML5, a sixth lower conductive pattern BML6, a seventh lower conductive pattern BML7, an eighth lower conductive pattern BML8, a ninth lower conductive pattern BML9, and a tenth lower conductive pattern BML10.

The first lower conductive pattern BML1 may extend in the first direction DR1. The low power supply voltage ELVSS may be applied to the first lower conductive pattern BML1. The first lower conductive pattern BML1 may serve as a wire for transmitting the low power supply voltage ELVSS.

The second lower conductive pattern BML2 may extend in the first direction DR1. An initialization voltage VINT or a sensing signal SL may be applied to the second lower conductive pattern BML2. The second lower conductive pattern BML2 may serve as a wire for transmitting the initialization voltage VINT or the sensing signal SL. The sensing signal SL may serve to check a device property of the first transistor T1 of FIG. 2. The initialization voltage VINT may serve to initialize the anode terminal of the light emitting diode ED.

The third lower conductive pattern BML3 may extend in the first direction DR1. The high power supply voltage ELVDD may be applied to the third lower conductive pattern BML3. The third lower conductive pattern BML3 may serve as a wire for transmitting the high power supply voltage ELVDD.

The fourth to seventh lower conductive patterns BML4, BML5, BML6, and BML7 may be disposed to be spaced apart from each other in the first direction DR1. Each of the fourth to seventh lower conductive patterns BML4, BML5, BML6, and BML7 may serve as a capacitor electrode. To this end, the high power supply voltage ELVDD may be applied to the fourth to seventh lower conductive patterns BML4, BML5, BML6 and BML7.

Each of the eighth to tenth lower conductive patterns BML8, BML9 and BML10 may extend in the first direction DR1. Different data signals may be applied to the eighth to tenth lower conductive patterns BML8, BML9 and BML10, respectively. The eighth to tenth lower conductive patterns BML8, BML9 and BML10 may serve as wires for transmitting different data signals, respectively.

Figure 4:
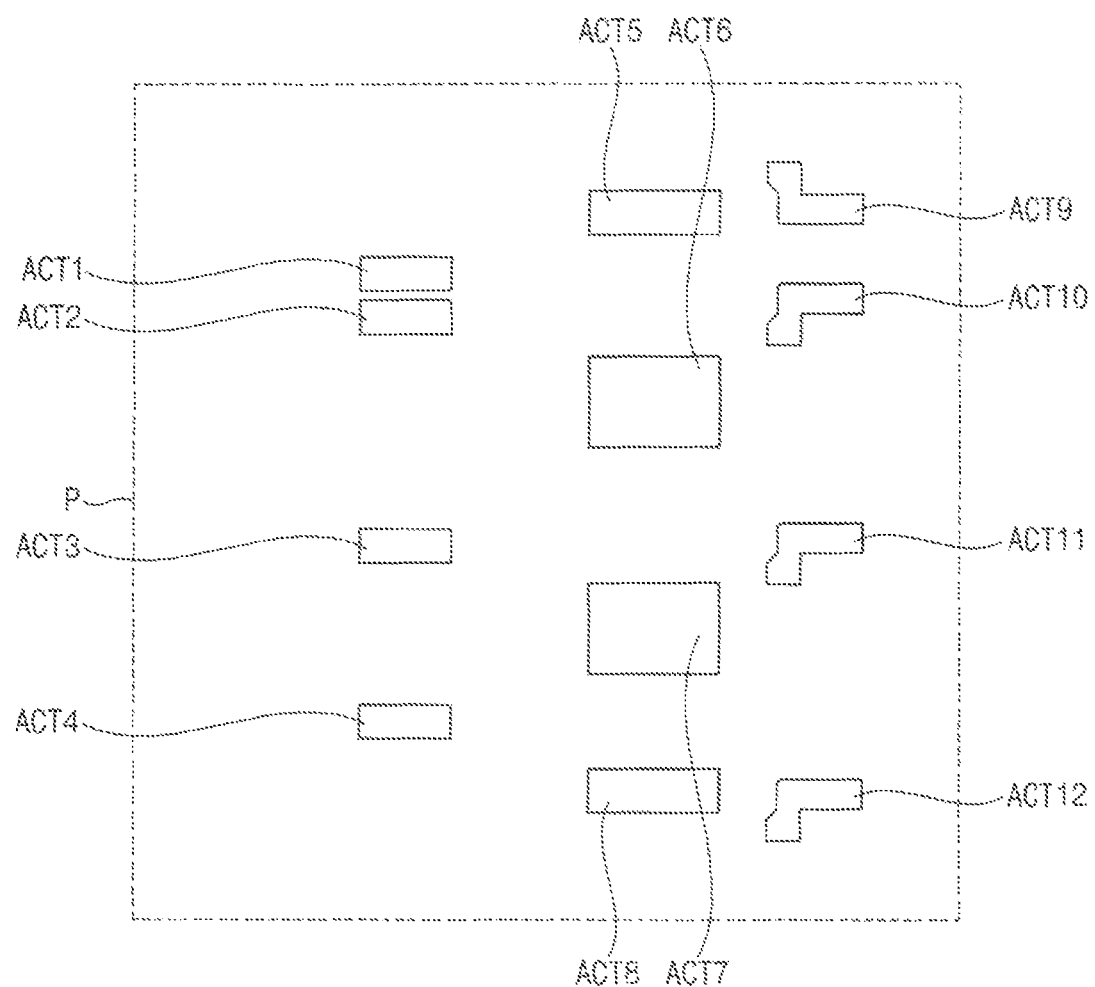

Referring to FIGS. 1 and 4, the display device DD may include an active layer. The active layer may include a silicon-based semiconductor material or an oxide-based semiconductor material. In the embodiments, the active layer may include a silicon semiconductor. Examples of materials usable as the active layer may include amorphous silicon, polycrystalline silicon and the like. Alternatively, in the embodiments, the active layer may include an oxide semiconductor. Examples of materials usable as the active layer may include indium-gallium-zinc oxide (IGZO), indium-gallium oxide (IGO), indium-zinc oxide (IZO), and the like.

The active layer may include a first active pattern ACT1, a second active pattern ACT2, a third active pattern ACT3, a fourth active pattern ACT4, a fifth active pattern ACT5, a sixth active pattern ACT6, a seventh active pattern ACT7, an eighth active pattern ACT8, a ninth active pattern ACT9, a tenth active pattern ACT10, an eleventh active pattern ACT11, and a twelfth active pattern ACT12.

The active layer may serve to transmit a signal between wires and/or electrodes in response to a gate signal.

Figure 5:
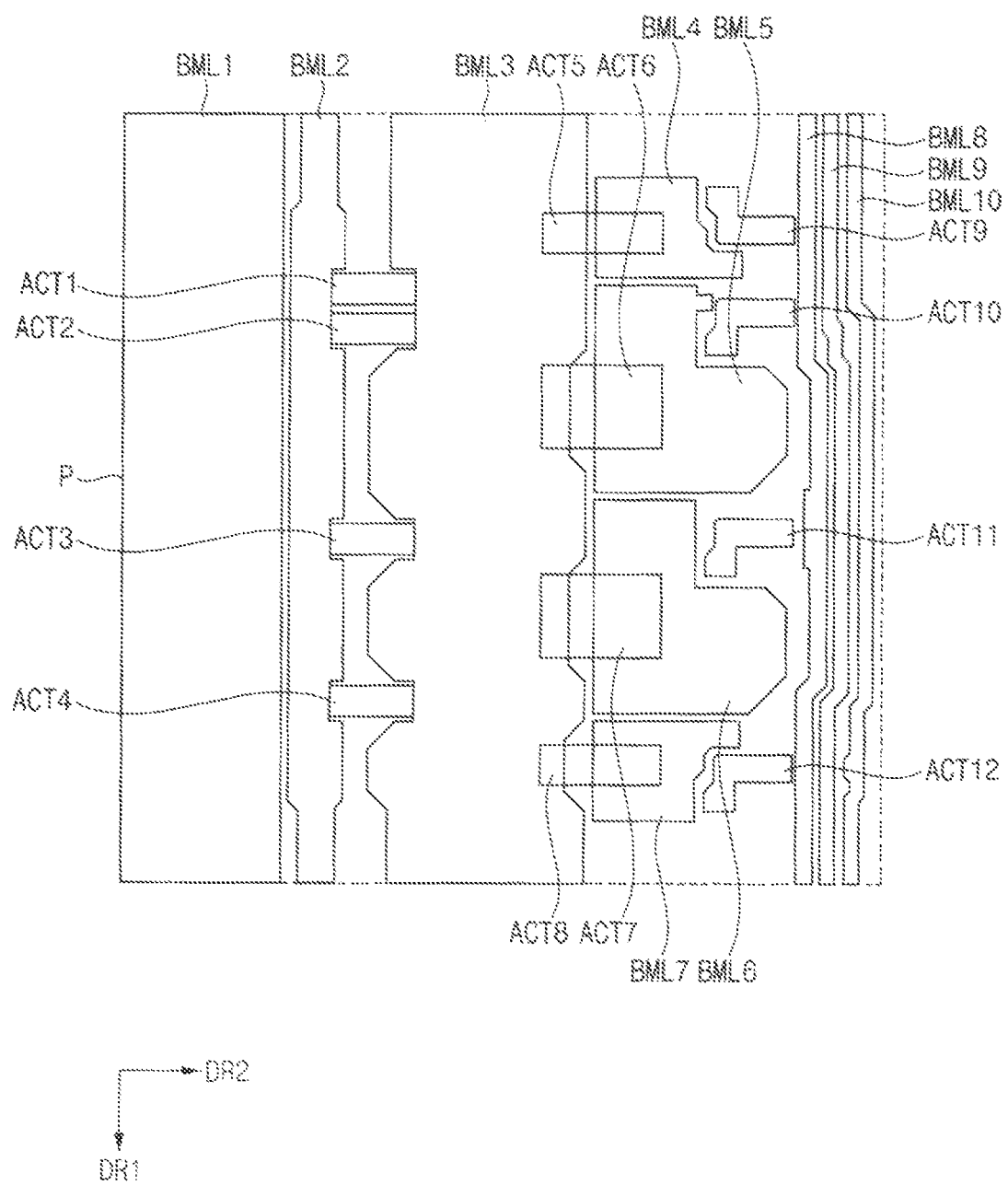

Referring to FIGS. 1 and 5, FIG. 5 may correspond to a view in which FIG. 3 is overlapped with FIG. 4. Some of the active patterns may be positioned to overlap the wires of the first conductive layer and the electrodes of the first conductive layer. In addition, the rest of the active patterns may not overlap the wires of the first conductive layer and the electrodes of the first conductive layer.

Figure 6:
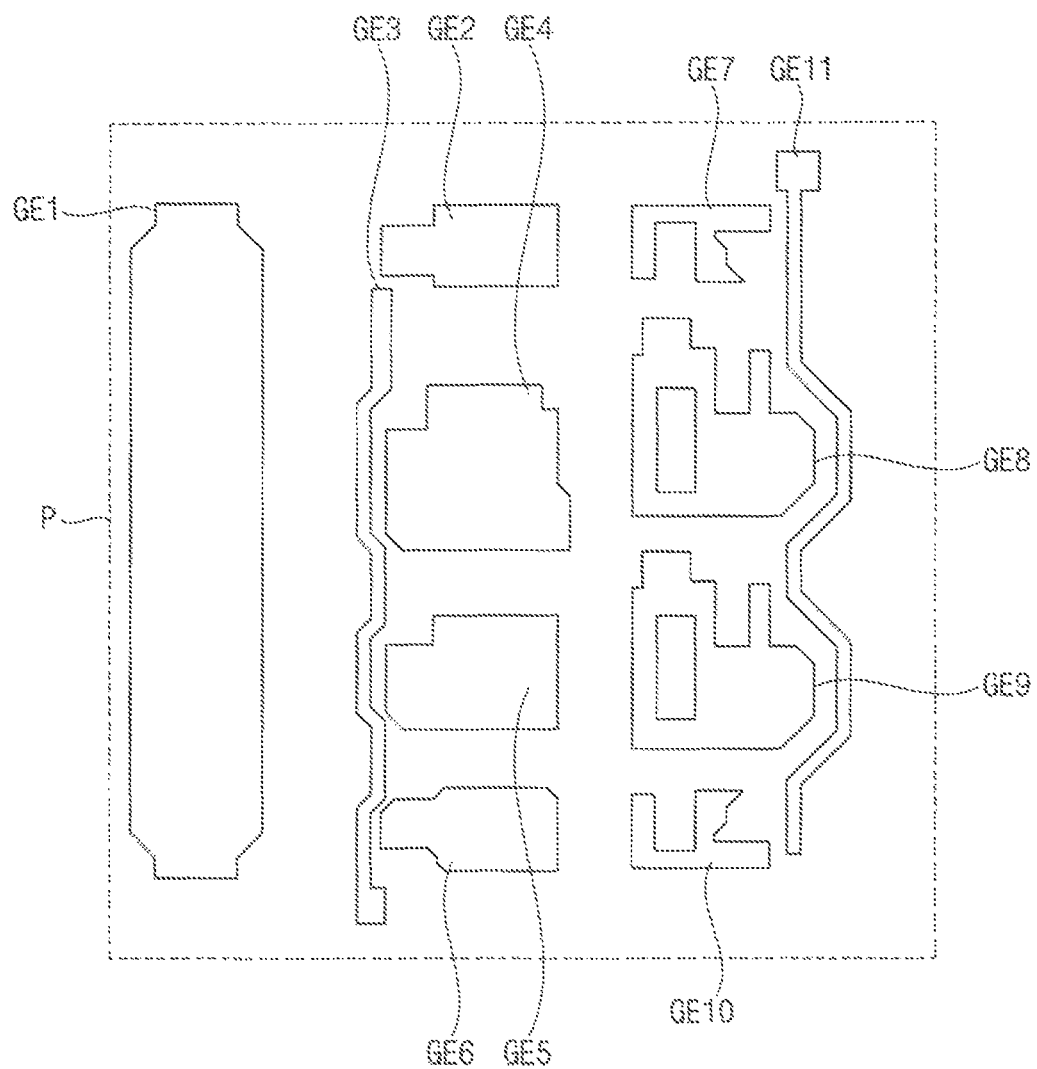
Figure 7:
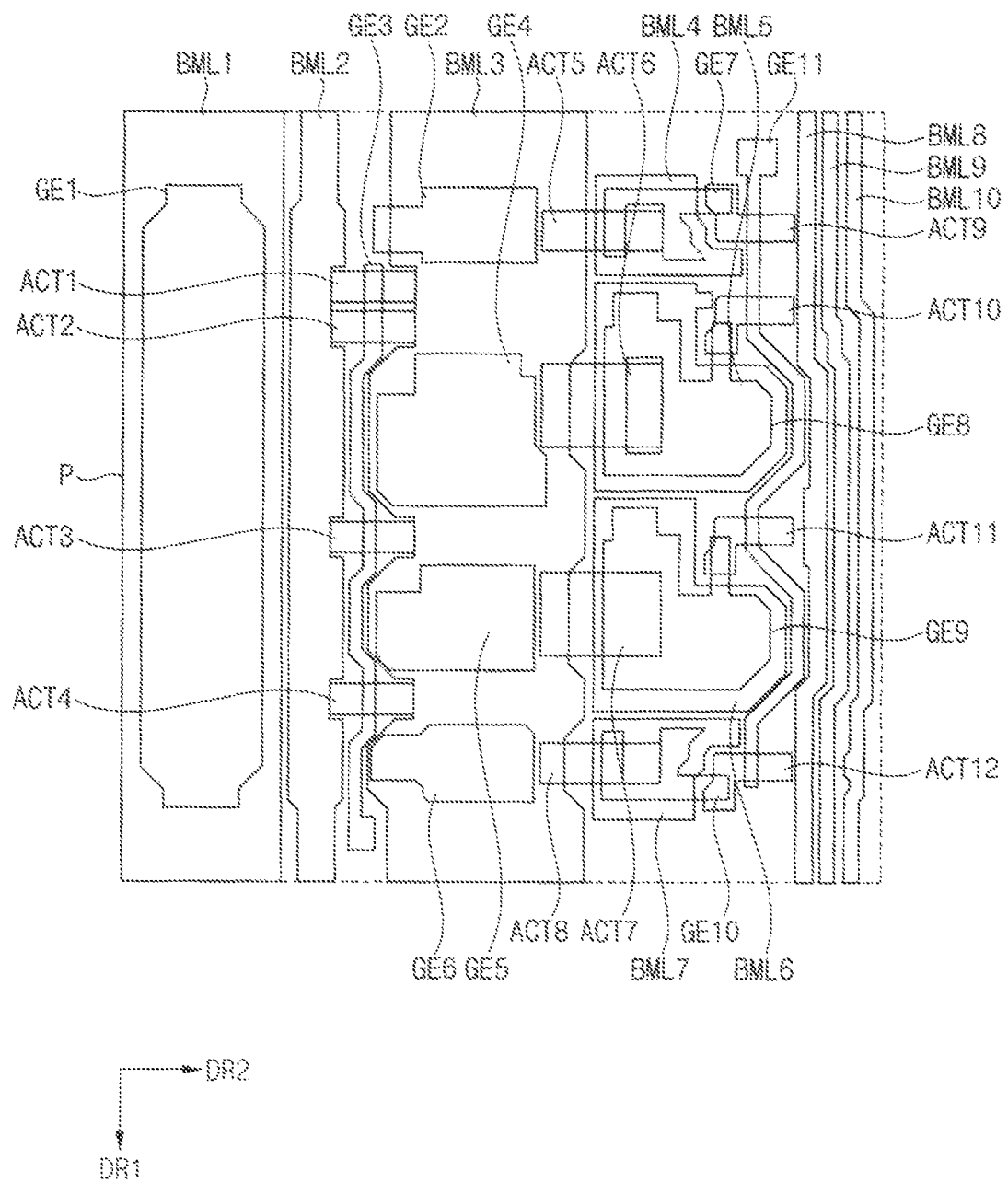

Referring to FIGS. 1, 6 and 7, the display device DD may include second conductive layer. The second conductive layer may be disposed on the first conductive layer. The second conductive layer may include metal, metal oxide, metal nitride, and the like. Examples of the metal may include silver, molybdenum, aluminum, tungsten (W), copper (Cu), nickel (Ni), chromium (Cr), titanium (Ti), tantalum (Ta), platinum (Pt), and scandium (Sc). These may be used individually or in combination. Examples of the metal oxide may include indium tin oxide (ITO), and indium zinc oxide (IZO). These may be used individually or in combination. Examples of the metal nitride may include aluminum nitride (AlN), tungsten nitride (WN), and chromium nitride (CrN). These may be used individually or in combination.

The second conductive layer may include a first gate pattern GE1, a second gate pattern GE2, a third gate pattern GE3, a fourth gate pattern GE4, a fifth gate pattern GE5, a sixth gate pattern GENS, a seventh gate pattern GE7, an eighth gate pattern GE8, a ninth gate pattern GE9, a tenth gate pattern GE10, and an eleventh gate pattern GE11.

The first gate pattern GE1 may extend in the first direction DR1. The first gate pattern GE1 may overlap the first lower conductive pattern BML1. The first gate pattern GE1 may be electrically connected to the first lower conductive pattern BML1. Accordingly, the low power supply voltage ELVSS may be applied to the first gate pattern GE1. The first gate pattern GE1 may serve to lower a resistance of the first lower conductive pattern. BML1.

The second gate pattern GE2 may overlap the third lower conductive pattern BML3. The second gate pattern GE2 may be electrically connected to the third lower conductive pattern BML3. Accordingly, the high power supply voltage ELVDD may be applied to the second gate pattern GE2 The second gate pattern GE2 may serve to lower a resistance of the third lower conductive pattern BML3.

The third gate pattern GE3 may extend in the first direction DR1. The third gate pattern GE3 may overlap the first to fourth active patterns ACT1, ACT2, ACT3, and ACT4. The first scan signal SS may be applied to the third gate pattern GE3. The first to fourth active patterns ACT1, ACT2, ACT3, and ACT4 may be activated by the first scan signal SS.

The fourth gate pattern GE4 may overlap the third lower conductive pattern BML3. The fourth gate pattern GE4 may be electrically connected to the third lower conductive pattern BML3. Accordingly, the high power supply voltage ELVDD may be applied to the fourth gate pattern GE4. The fourth gate pattern GE4 may serve to lower a resistance of the third lower conductive pattern BML3.

The fifth gate pattern GE5 may overlap the third lower conductive pattern BML3. The fifth gate pattern GE5 may be electrically connected to the third lower conductive pattern BML3. Accordingly, the high power supply voltage ELVDD may be applied to the fifth gate pattern GE5. The fifth gate pattern GE5 may serve to lower a resistance of the third lower conductive pattern BML3.

The sixth gate pattern GE6 may overlap the third lower conductive pattern BML3. The sixth gate pattern GEC may be electrically connected to the third lower conductive pattern BML3. Accordingly, the high power supply voltage ELVDD may be applied to the sixth gate pattern GE6. The sixth gate pattern GE6 may serve to lower a resistance of the third lower conductive pattern. BML3.

The seventh to tenth gate patterns GE7, GE8, GE9, and GE10 may be disposed to be spaced apart from each other in the first direction DR1. The seventh gate pattern GE7 may overlap the fourth lower conductive pattern BML4, the eighth gate pattern GE8 may overlap the fifth lower conductive pattern BML5, the ninth gate pattern GE9 may overlap the sixth lower conductive pattern BML6, and the tenth gate pattern GE10 may overlap the seventh lower conductive pattern BML7. The seventh gate pattern GE7 may form the first capacitor together with the fourth lower conductive pattern BML4, the eighth gate pattern GE8 may form the second capacitor together with the fifth lower conductive pattern BML5, the ninth gate pattern GE9 may form the third capacitor together with the sixth lower conductive pattern BML6, and the tenth gate pattern GE10 may form the fourth capacitor together with the seventh lower conductive pattern BML7.

The planar area of the first capacitor may be smaller than the planar area of each of the second capacitor and the third capacitor. For example, the planar area of the first capacitor may be less than or equal to a half the planar area of each of the second capacitor and the third capacitor.

In addition, the planar area of the fourth capacitor may be smaller than the planar area of each of the second capacitor and the third capacitor. For example, the planar area of the fourth capacitor may be less than or equal to a half the planar area of each of the second capacitor and the third capacitor.

The eleventh gate pattern GE11 may extend in the first direction DR1. The eleventh gate pattern GE11 may overlap the ninth to twelfth active patterns ACT9, ACT10, ACT11, and ACT12. The second scan signal SC may be applied to the eleventh gate pattern GE11. The ninth to twelfth active patterns ACT9, ACT10, ACT11, and ACT12 may be activated by, the second scan signal SC.

Figure 9:
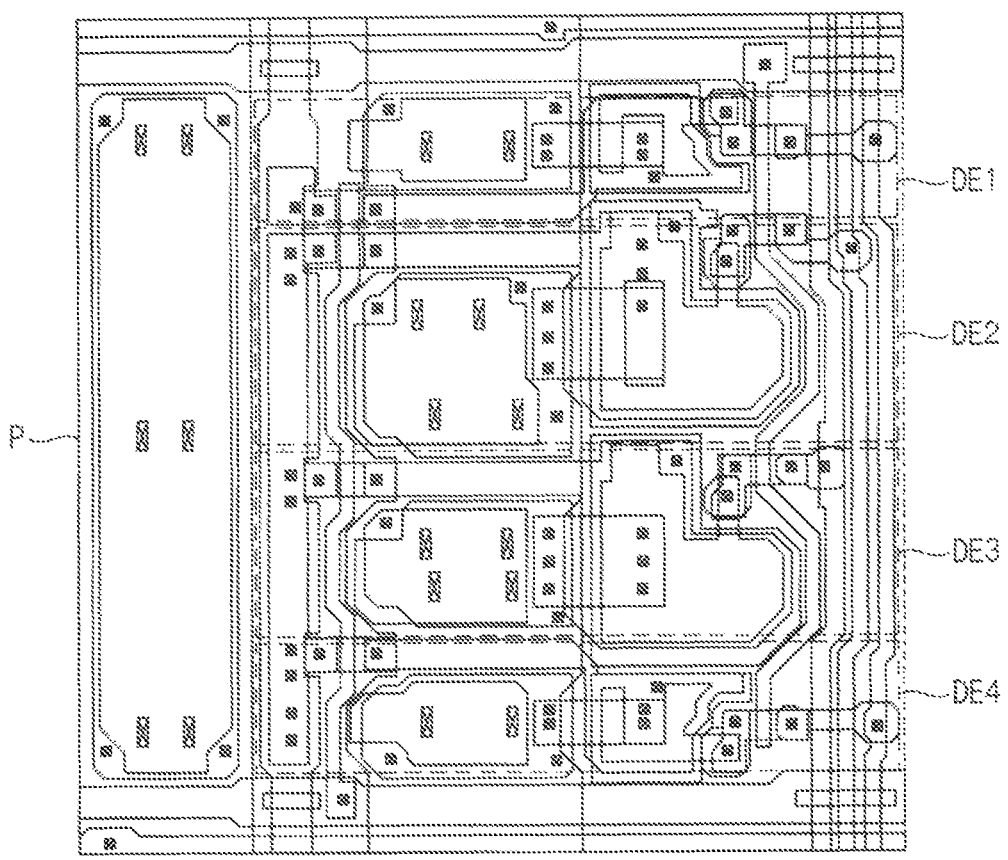

Referring to FIGS. 1, 8 and 9, the display device DD may further include a third conductive layer. The third conductive layer may be disposed on the second conductive layer. The third conductive layer may receive signals transmitted through the first conductive laver. The third conductive layer may include metal, metal oxide, metal nitride, and the like. Examples of the metal may include silver, molybdenum, aluminum, tungsten (W), copper (Cu), nickel (Ni), chromium (Cr), titanium (II), tantalum (Ta), platinum (Pt), and scandium (Sc). These may be used individually or in combination. Examples of the metal oxide may include indium tin oxide (ITO), and indium zinc oxide (ILO). These may be used individually or in combination. Examples of the metal nitride may include aluminum nitride (AlN), tungsten nitride (WN), and chromium nitride (CrN). These may be used individually or in combination.

In the embodiments, the display device DD may include a plurality of sub-pixels. For example, the display device DD may include first to fourth sub-pixels. Each of the first to fourth sub-pixels may include drive elements. As shown in FIG. 9, the display device DD may include first to fourth driving elements DE1, DE2, DE3, and DE4. A planar area of each of the first driving elements DE1 and the fourth driving elements DE4 may be smaller than a planar area of each of the second driving elements DE2 and the third driving elements DE3. More specifically-, the planar area of each of the first driving elements DE1 and the fourth driving elements DE4 may be less than or equal to a half of the planar area of each of the second driving elements DE2 and the third driving elements DE3. For example, the planar area of the transistors and a planar area of a plurality of capacitors of the first driving elements DE1 may be less than or equal to a half the planar area of a plurality of transistors of each of the third driving elements DE3 and the fourth driving elements DE4, and the planar area of the capacitor of, each of the third driving elements DE3 and the fourth driving elements DE4. In addition, the planar area of the transistors and the planar area of the capacitor of the fourth driving elements DE4 may be less than or equal to a half the planar area of a plurality of transistors of each of the third driving elements DE3 and the fourth driving elements DE4, and the planar area of the capacitor of each of the third driving elements DE3 and the fourth driving elements DE4.

The third conductive layer may include a first upper conductive pattern CE1, second upper conductive pattern CE2, a third upper conductive pattern CE3, a fourth upper conductive pattern CE4, a fifth upper conductive pattern CE5, a sixth upper conductive pattern CE6, a seventh upper conductive pattern CE7, an eighth upper conductive pattern CE8, a ninth upper conductive pattern CE9, a tenth upper conductive pattern CE10, an eleventh upper conductive pattern CE11, a twelfth upper conductive pattern CE12, a thirteenth upper conductive pattern CE13, a fourteenth upper conductive pattern CE14, a fifteenth upper conductive pattern CE15, a sixteenth upper conductive pattern CE16, a seventeenth upper conductive pattern CE17, an eighteenth upper conductive pattern CE18, a nineteenth upper conductive pattern CE19, a twentieth upper conductive pattern CE20, a twenty-first upper conductive pattern CE21, a twenty second upper conductive pattern CE22, and a twenty-third upper conductive pattern CE23.

The first upper conductive pattern CE1 may extend in a second direction DR2 intersecting the first direction DR1. The high power supply voltage ELVDD may be applied to the first upper conductive pattern CE1 The first upper conductive pattern CE1 may be electrically connected to the third lower conductive pattern BML3. The first upper conductive pattern CE1 may be a wire that generally transmits the high power supply voltage ELVDD to the display device DD.

The second upper conductive pattern CE2 may extend in the second direction DR2. A second scan signal SC may be applied to the second upper conductive pattern CE2. The second upper conductive pattern CE2 may be electrically connected to the eleventh gate pattern GE11. In other words, the second scan signal SC may be applied to the eleventh gate pattern GE11 through the second upper conductive pattern CE2.

The third upper conductive pattern CE3 may extend in the first direction DR1. The third upper conductive pattern. CE3 may be electrically connected to the first lower conductive pattern BML1 and the first gate pattern GE1, Accordingly, the low power supply voltage ELVSS may be applied to the third upper conductive pattern CE3. The third upper conductive pattern CE3 may serve to lower a resistance of the first lower conductive pattern BML1.

The fourth upper conductive pattern CE4 may extend in the second direction DR2. The first scan signal SS may be applied to the fourth upper conductive pattern CE4. The fourth upper conductive pattern CE4 may be electrically connected to the third gate pattern GE3. In other words, the first scan signal SS may be applied to the third gate pattern GE3 through the fourth upper conductive pattern CE4.

The fifth upper conductive pattern CE5 may extend in the second direction DR2. The fifth upper conductive pattern CE5 may be electrically connected to the first lower conductive pattern BML1. Accordingly, the low power supply voltage ELVSS may be applied to the fifth upper conductive pattern CE5. The fifth upper conductive pattern CE5 may be a wire that transmits the low power supply voltage ELVSS to the display device DD as a whole.

The sixth upper conductive pattern CE6 may overlap the second gate pattern GE2. The sixth upper conductive pattern CE6 may be electrically connected to each of the third lower conductive pattern BML3, the second gate pattern GE2, and the fifth active pattern ACT5. The high power supply voltage ELVDD may be applied to the sixth upper conductive pattern CE6.

The seventh upper conductive pattern CE7 may overlap the second lower conductive pattern BML2 and the first active pattern ACT1. The seventh upper conductive pattern CE7 may be electrically connected to each of the second lower conductive pattern BML2 and the first active pattern ACT1. The sensing signal SL may be applied to the seventh upper conductive pattern CE7.

The eighth upper conductive pattern CE8 may overlap the second lower conductive pattern BLM2, the second active pattern ACT2, the third active pattern ACT3, and the fourth active pattern ACT4. The eighth upper conductive pattern CE8 may be electrically connected to each of the second lower conductive pattern BML2, the second active pattern ACT2, the third active pattern ACT3, and the fourth active pattern ACT4. The sensing signal SL may be applied to the eighth upper conductive pattern CE8.

The ninth upper conductive pattern CE9 may be electrically connected to the seventh upper conductive pattern CE7 by the first active pattern ACT1. The first active pattern ACT1, the third gate pattern GE3, the seventh upper conductive pattern CE7, and the ninth upper conductive pattern CE9 may form an initialization transistor of the first driving elements DE1. In addition, the fifth active pattern ACT5, the seventh gate pattern GE7, the sixth upper conductive pattern CE7, and the ninth upper conductive pattern CE9 may form a driving transistor of the first driving elements DE1.

The tenth upper conductive pattern CE10 may be electrically connected to the eighth upper conductive pattern CE8 by the second active pattern ACT2. The second active pattern ACT2, the third gate pattern GE3, the eighth upper conductive pattern CE8, and the tenth upper conductive pattern CE10 may form an initialization transistor of the second driving elements DE2. In addition, the sixth active pattern ACT6, the eighth gate pattern GE5, the tenth upper conductive pattern CE10, and the eleventh upper conductive pattern CE11 may form a driving transistor of the second driving elements DE2.

The eleventh upper conductive pattern CE11 may be electrically connected to the third lower conductive pattern. BML3 and the fourth gate pattern GE4.

The twelfth upper conductive pattern CE12 may be electrically connected to the eighth upper conductive pattern CE8 by the third active pattern ACT3. The third active pattern ACT3, the third gate pattern. GE3, the eighth upper conductive pattern CE8, and the twelfth upper conductive pattern CE12 may form an initialization transistor of the third driving elements DE3. In addition, the seventh active pattern ACT7 the ninth gate pattern GE9, the twelfth upper conductive pattern CE12, and the thirteenth upper conductive pattern CE13 may form a driving transistor of the third driving elements DE3.

The thirteenth upper conductive pattern CE13 may be electrically connected to the third lower conductive pattern BML3 and the fifth gate pattern GE5.

The fourteenth upper conductive pattern CE14 may be electrically connected to the eighth upper conductive pattern CE8 by the fourth active pattern ACT4. The fourth active pattern ACT4, the third gate pattern GE3, the eighth upper conductive pattern CE8, and the fourteenth upper conductive pattern CE14 may form an initialization transistor of the fourth driving elements DE4. In addition, the eighth active pattern ACT8, the tenth gate pattern GE10, the fourteenth upper conductive pattern CE14, and the fifteenth upper conductive pattern CE15 may form a driving transistor of the fourth driving elements DE4.

The sixteenth upper conductive pattern CE16 and the seventeenth upper conductive pattern CE17 may form a switching transistor of the first driving elements DE1 together with the eleventh gate pattern GE11 and the ninth active pattern ACT9. The sixteenth upper conductive pattern CE16 may be electrically connected to the seventh gate pattern GE7 and the ninth active pattern ACT9. The seventeenth upper conductive pattern CE17 may be electrically connected to the tenth lower conductive pattern BML10 and the ninth active pattern ACT9.

The eighteenth upper conductive pattern CE18 and the nineteenth upper conductive pattern CE19 may form a switching transistor of the second driving elements DE2 together with the eleventh gate pattern GE11 and the tenth active pattern ACT10. The eighteenth upper conductive pattern. CE18 may be electrically connected to the eighth gate pattern GE8 and the tenth active pattern ACT10, The nineteenth upper conductive pattern CE19 may be electrically connected to the ninth lower conductive pattern BLM8 and the tenth active pattern ACT10.

The twentieth upper conductive pattern CE20 and the twenty-first upper conductive pattern CE21 may form a switching transistor of the third driving elements DE3 together with the eleventh gate pattern GE11 and the eleventh active pattern ACT11. The twentieth upper conductive pattern CE20 may be electrically connected to the ninth gate pattern GE5 and the eleventh active pattern ACT11. The twenty-first upper conductive pattern CE21 may be electrically connected to the eighth lower conductive pattern BML8 and the eleventh active pattern ACT11.

The twenty-second upper conductive pattern CE22 and the twenty-third upper conductive pattern CE23 may form a switching transistor of the fourth driving elements DE4 together with the eleventh gate pattern GE11 and the twelfth active pattern ACT12. The twenty-second upper conductive pattern CE22 may be electrically connected to the tenth gate pattern GE10 and the twelfth active pattern ACT12. The twenty-third upper conductive pattern CE23 may be electrically connected to the tenth lower conductive pattern BML10 and the twelfth active pattern ACT12.

Figure 10:
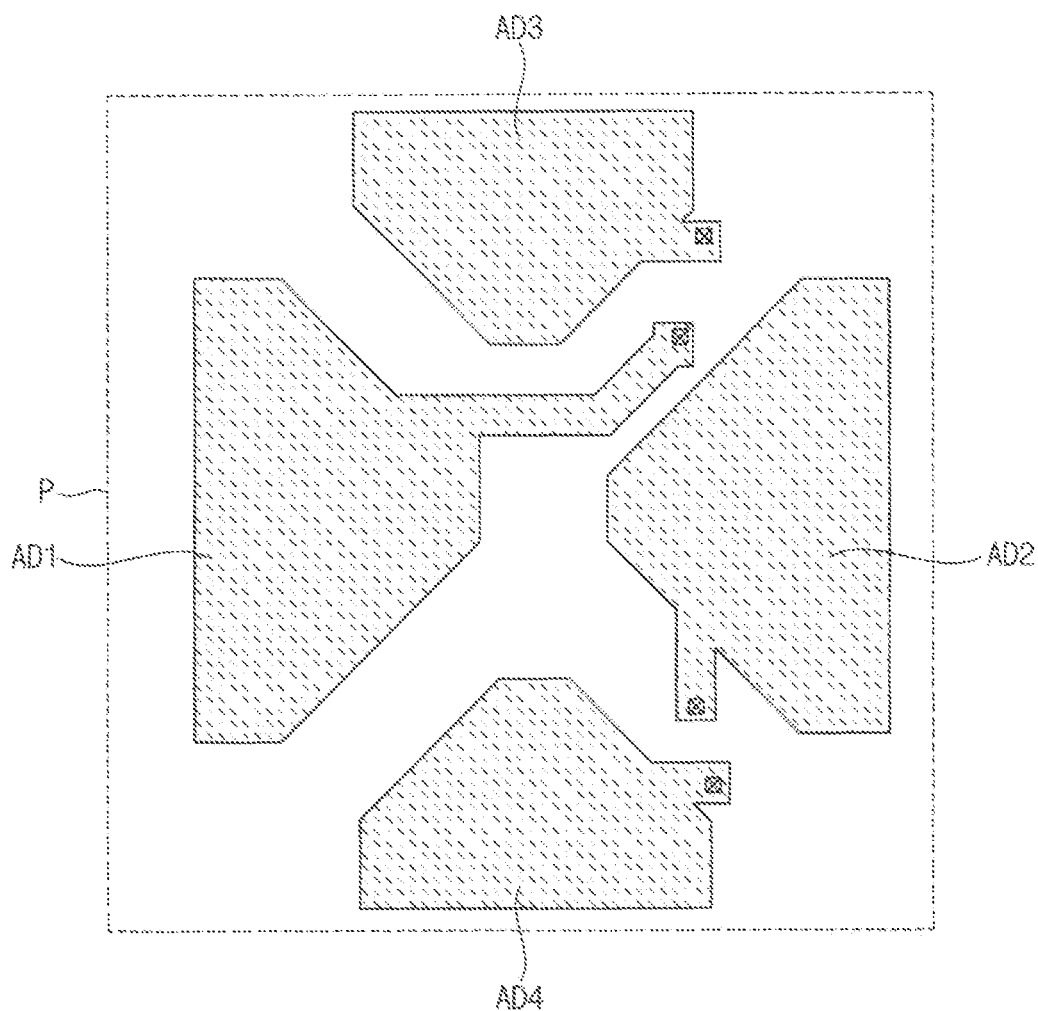
Figure 11:
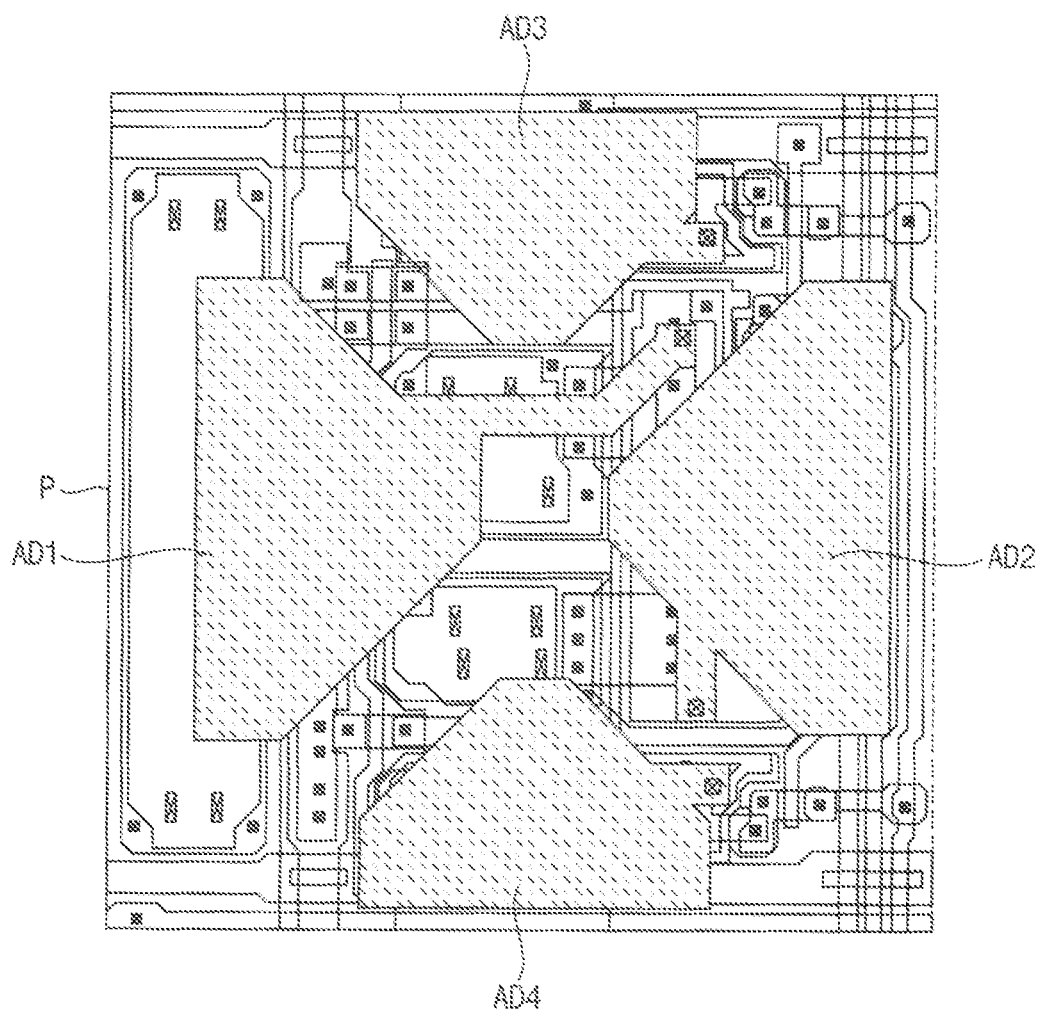

Referring to FIGS. 1, 10 and 11, the display device DD may further include a fourth conductive layer. The fourth conductive layer may be disposed on the third conductive layer. The fourth conductive layer may include metal, metal oxide, metal nitride, and the like. Examples of the metal may include silver, molybdenum, aluminum, tungsten (W), copper (Cu), nickel (Ni), chromium (Cr), titanium (Ti), tantalum (Ta), platinum (Pt), and scandium (Sc). These may be used individually or in combination. Examples of the metal oxide may include indium tin oxide (1'TO), and indium zinc oxide (WO). These may be used individually or in combination. Examples of the metal nitride may include aluminum nitride (AlN), tungsten nitride (WN), and chromium nitride (CrN). These may be used individually or in combination.

The fourth conductive layer may include a first anode pattern AD1, a second anode pattern AD2, a third anode pattern AD3, and a fourth anode pattern AD4. The third anode pattern AD3 and the fourth anode pattern AD4 may be spaced apart from each other in the first direction DR1. The first anode pattern AD1 and the second anode pattern AD2 may be disposed between the third anode pattern AD3 and the fourth anode pattern AD4. The first anode pattern AD1 and the second anode pattern AD2 may partially overlap the third anode pattern AD3 and the fourth anode pattern AD4 in the first direction DR1. In addition, the first anode pattern AD1 and the second anode pattern AD2 may partially overlap the third anode pattern AD3 and the fourth anode pattern AD4 in the second direction DR2. In addition, the first anode pattern AD1 and the second anode pattern AD2 may partially overlap the third anode pattern AD3 and the fourth anode pattern AD4 in the first direction DR1 and the second direction DR2.

The first anode pattern AD1 may be electrically connected to the tenth upper conductive pattern CE10. The high power supply voltage ELVDD may be applied to the first anode pattern AD1. The second anode pattern AD2 may be electrically connected to the twelfth upper conductive pattern CE12. The high power supply voltage ELVDD may be applied to the second anode pattern AD2. The third anode pattern AD3 may be electrically connected to the ninth upper conductive pattern CE9. The high power supply voltage ELVDD may be applied to the third anode pattern AD3. The fourth anode pattern AD4 may be electrically connected to the fourteenth upper conductive pattern CE14. The high power supply voltage ELVDD may be applied to the fourth anode pattern AD4.

When viewed in a planar view, an area of the third anode pattern AD3 may be smaller than an area of each of the first anode pattern AD1 and the second anode pattern AD2. Specifically, the area of the third anode pattern AD3 may be less than or equal to a half the area of each of the first anode pattern AD1 and the second anode pattern AD2. In addition, an area of the fourth anode pattern AD4 may be smaller than an area of each of the first anode pattern AD1 and the second anode pattern AD2. Specifically, the area of the fourth anode pattern AD4 may be less than or equal to a half the area of each of the first anode pattern AD1 and the second anode pattern AD2.

Accordingly, in the present embodiments, the third anode pattern AD3 and the fourth anode pattern AD4 to which the same data signal is applied may be separately disposed. Light having the same color may be emitted in the region overlapping the third anode pattern AD2 and the fourth anode pattern AD4 separated in the first direction DR1. Accordingly, a color difference may be prevented from occurring at an end of the display device DD in the first direction DR1 and at an end of the display device DD in a direction opposite to the first direction DR1. In other words, the display device DD according to the present embodiments may realize a green color at both ends of the display device DD in the first direction DR1.

FIGS. 10 and 11 show that each of the anode patterns has a substantially triangular shape, however, this is merely exemplary. The shape of each anode pattern is not limited thereto. However, the area of each of the separately disposed two anode patterns to which the same data signal is applied may be smaller than the area of each of the remaining anode patterns. Preferably, the area of each of the two anode patterns may be less than or equal to a half the area of each of the remaining anode patterns.

Figure 12:
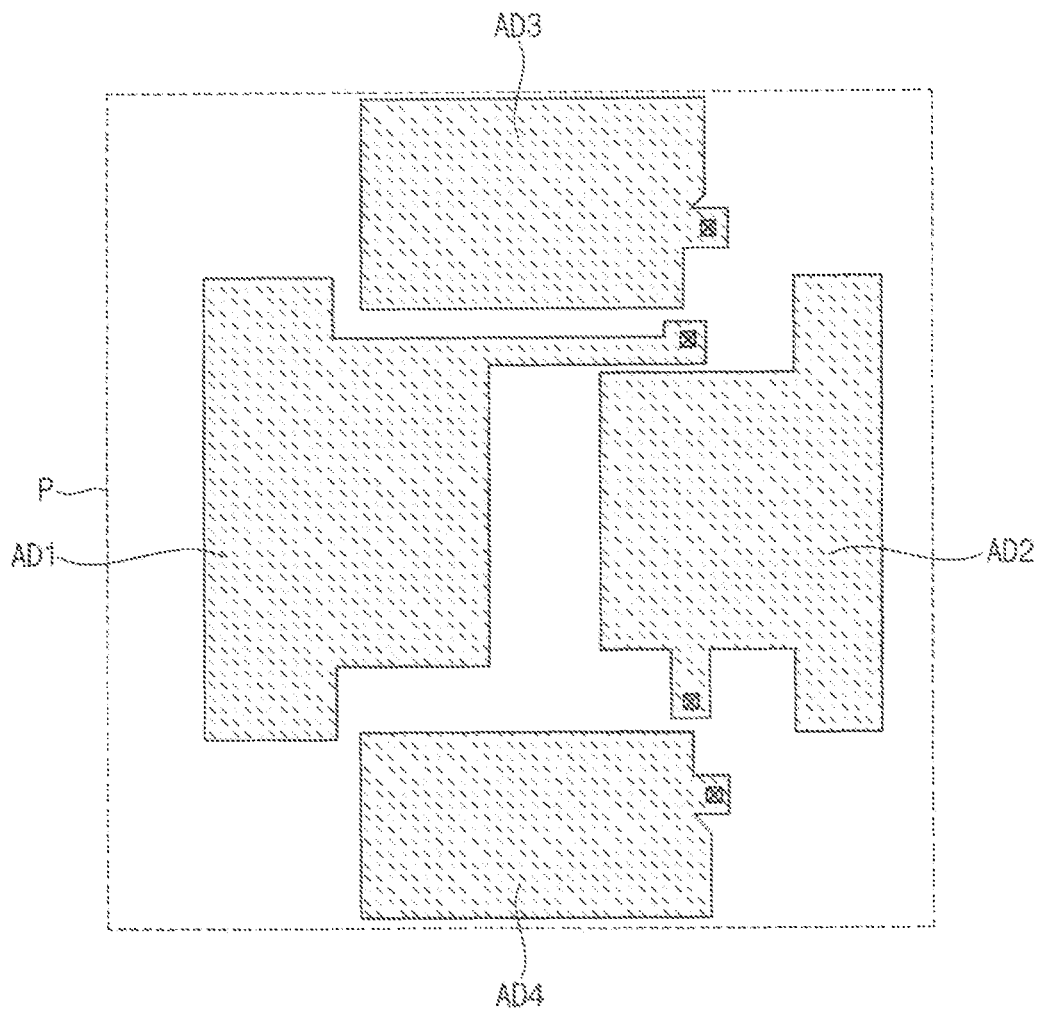
FIGS. 12 and 13 are layout diagrams showing another embodiment of the pixel included in the display device of FIG. 1.
Figure 13:
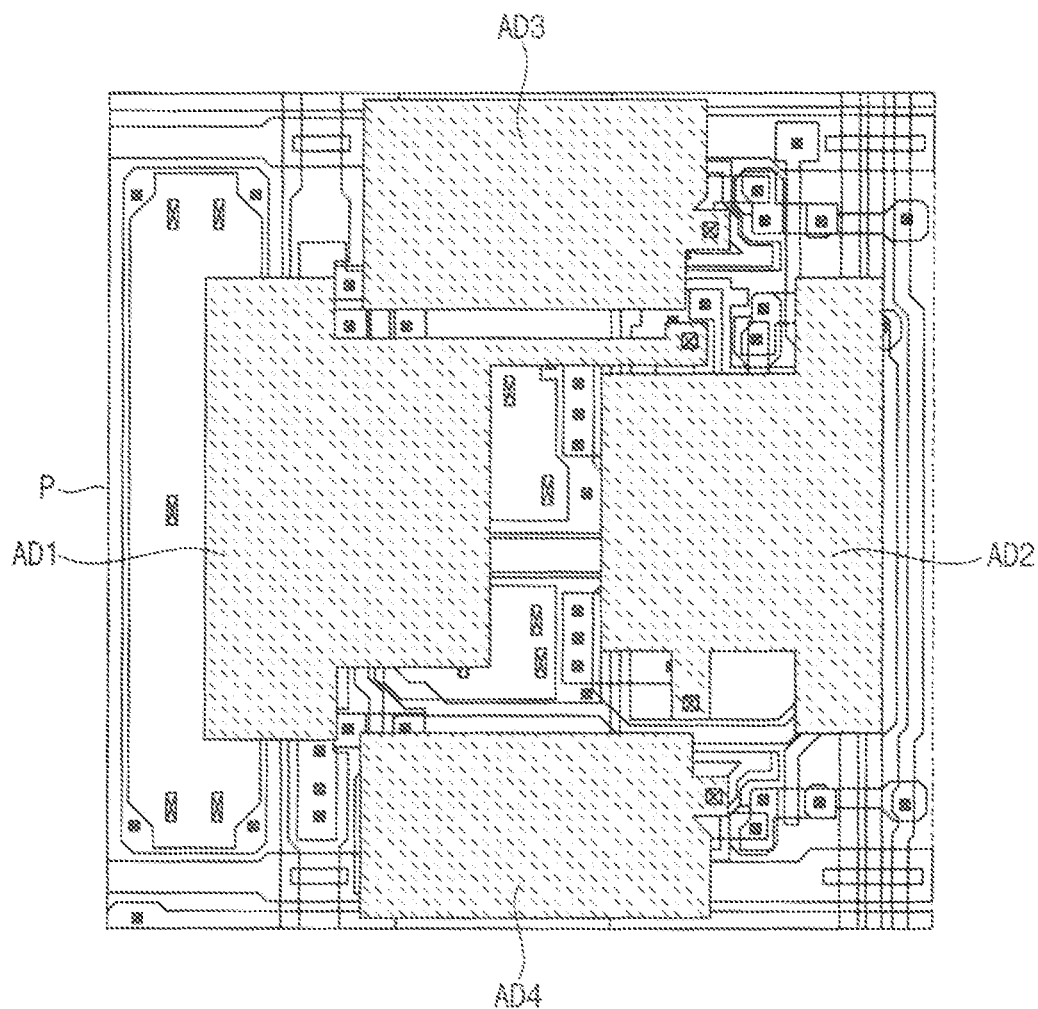
Figure 14:
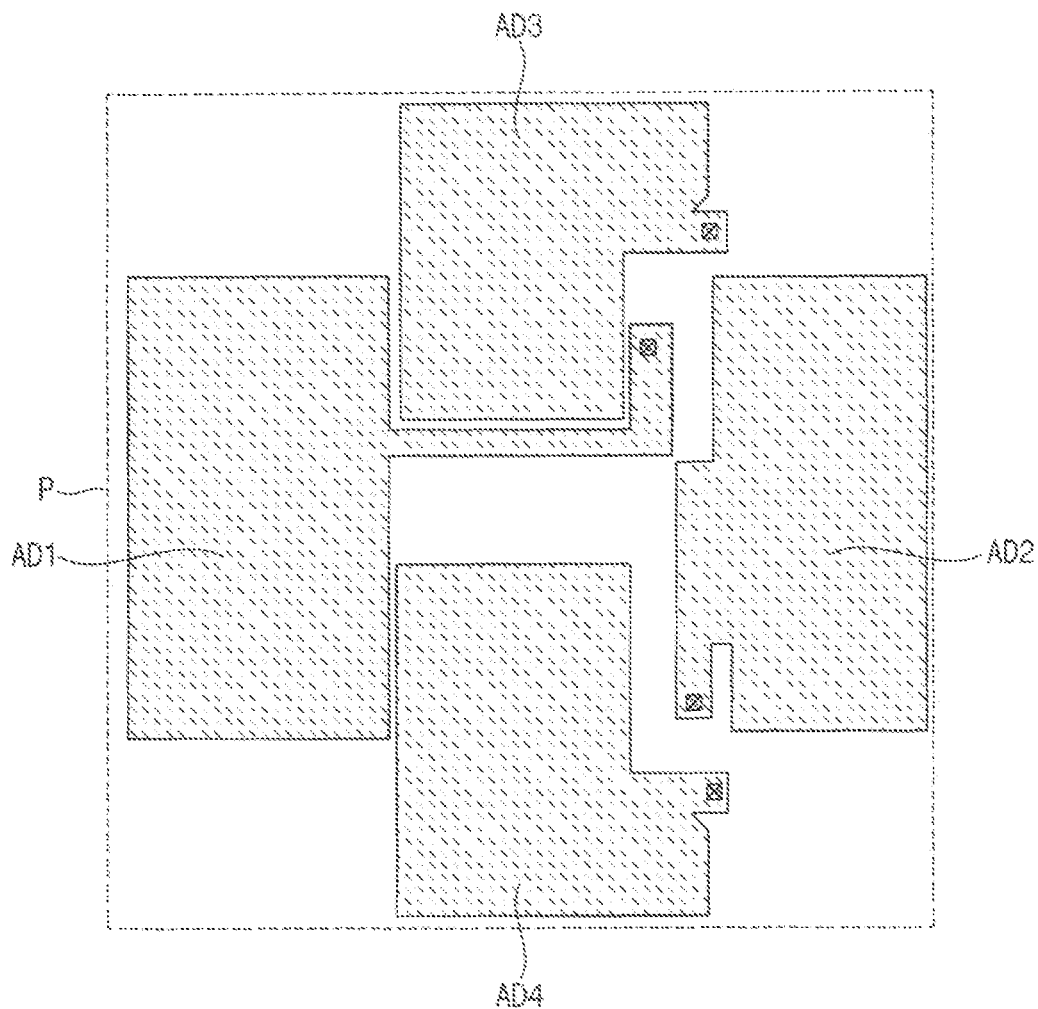
FIGS. 14 and 15 are layout diagrams showing another embodiment of the pixel included in the display device of FIG. 1.
Figure 15:
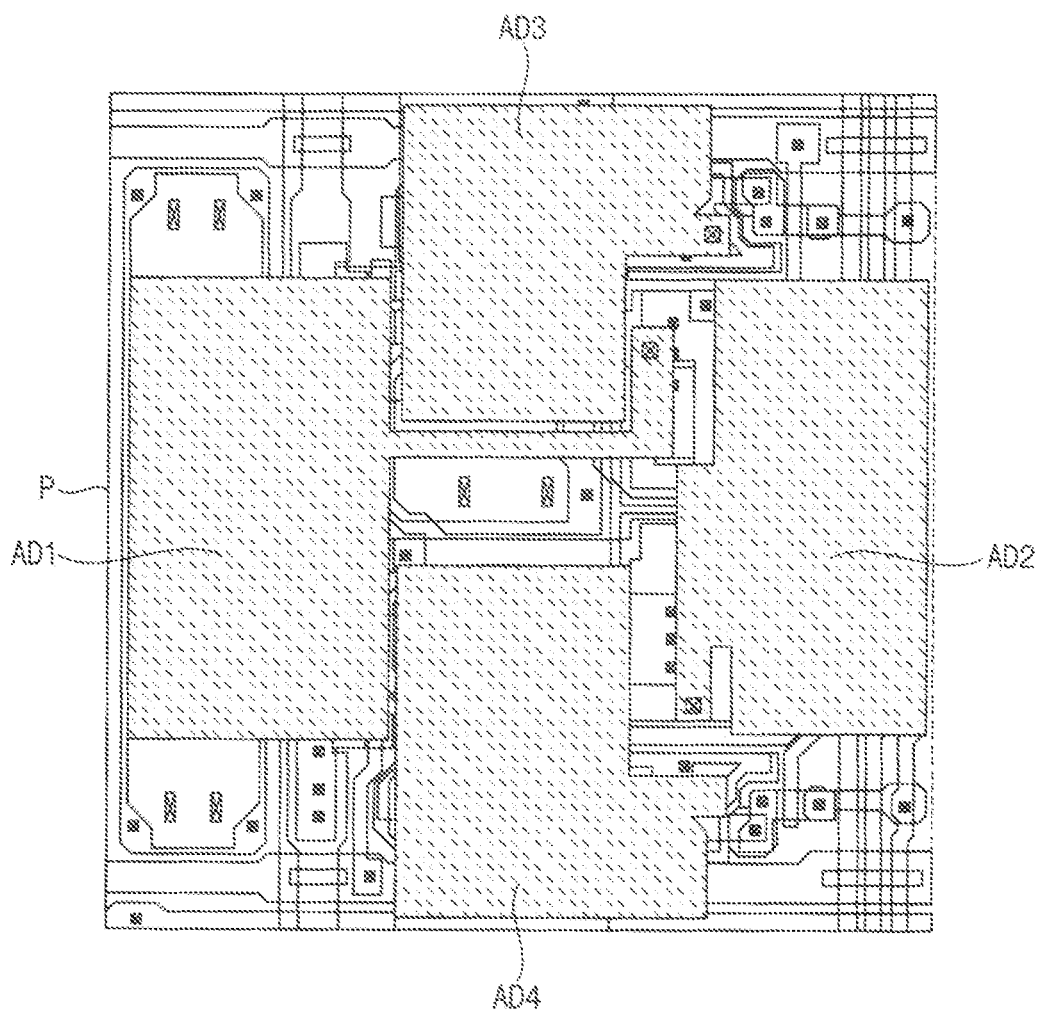

For example, as shown in FIGS. 12 and 13, each anode pattern may have a rectangular shape or a 'T' shape. In addition, as shown in FIGS. 14 and 15, each anode pattern may be disposed to have a shape similar to a rectangular shape as a whole.

Figure 16:
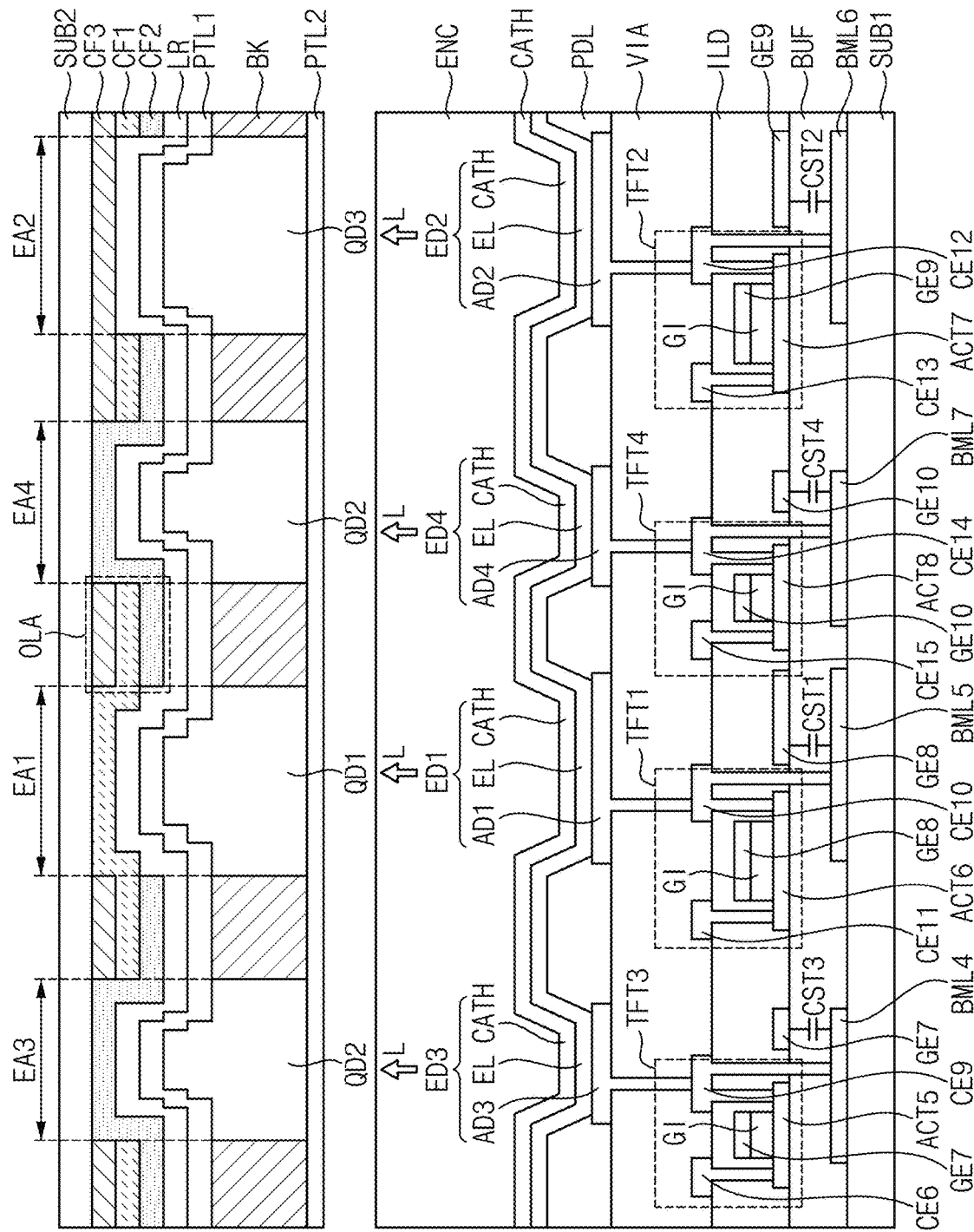
FIG. 16 is a sectional view schematically showing one embodiment taken along the line 14 of FIG. 1.

FIG. 16 is a sectional view schematically showing one embodiment taken along the line I-I' of FIG. 1.

Referring to FIGS. 1 and 16, the display device DD may include a first substrate SUB1, fourth to seventh lower conductive patterns BML4, BML5, BML6, and BML7, buffer layer BUF, fifth to eighth active patterns ACT5, ACT6, ACT7, and ACT8, a gate insulating layer GI, seventh to tenth gate patterns GE7, GE8, GE9, and GE10, an interlayer insulating layer ILD, a sixth upper conductive pattern CE6, a ninth upper conductive pattern CE9, tenth to fifteenth upper conductive patterns CE10, CE11, CE12, CE13, CE14, and CE15, a via insulating layer VIA, first to fourth light emitting diodes ED1, ED2, ED3, and ED4, a pixel defining layer PDL, an encapsulation layer ENC, a second substrate SUB2, first to third color filters CF1, CF2 and CF3, a refractive layer LR, first and second protective layers PTL1 and PTL2, a bank layer BK, and first and second color conversion layers QD1 and QD2 and a light transmitting layer QD3.

Each of the first to fourth light emitting diodes ED1, ED2, ED3, and ED4 may include a corresponding one of first to fourth anode patterns AD1, AD2, AD3 and AD4, an intermediate layer EL and a cathode electrode CATH. A region in which the first anode pattern AD1 overlaps the intermediate layer EL and the cathode electrode CATH may be defined as a first light emitting region EA1, a region in which the second anode pattern AD2 overlaps the intermediate layer EL and the cathode electrode CATH may be defined as a second light emitting region EA2, a region in which the third anode pattern AD3 overlaps the intermediate layer EL and the cathode electrode CATH may be defined as a third light emitting region EA3, and a region in which the fourth anode pattern AD4 overlaps the intermediate layer EL and the cathode electrode CATH may be defined as a fourth light emitting region EA4. As shown in the drawings, the anode patterns AD1, AD2, AD3, and AD4 have different sizes, and accordingly, the areas of the light emitting regions EA1, EA2, EA3, and EA4 may also be different. For example, each of the first and second light emitting regions EA1 and EA2 may be wider than each of the third and fourth light emitting regions EA3 and EA4. In addition, the sizes of driving elements (such as transistors and capacitors) for driving the first to fourth light emitting diodes ED1, ED2, ED3, and ED4 may be proportional to the areas of the light emitting regions EA1, EA2, EA3, and EA4.

The first substrate SUB1 may include glass. Accordingly, the first substrate SUB1 may have rigidity. Alternatively, the first substrate SLIM may have flexibility when fabricated or patterned at a certain thickness or below.

The fourth to seventh lower conductive patterns BML4, BML5, BML6, and BML7 may be disposed on the first substrate SUB1. The fourth to seventh lower conductive patterns BML4, BML5, BML6, and BML7 may include metal, metal oxide, metal nitride, and the like. Examples of the metal may include silver, molybdenum, aluminum, tungsten (W), copper (Cu), nickel (Ni), chromium (Cr), titanium (Ti), tantalum (Ta), platinum (Pt), and scandium (Sc). These may be used individually or in combination. Examples of the metal oxide may include indium tin oxide (ITO), and indium zinc oxide (IZO). These may be used individually or in combination. Examples of the metal nitride may include aluminum nitride (AlN), tungsten nitride (WN), and chromium nitride (CrN). These may be used individually or in combination.

The buffer layer BUF may be disposed on the first substrate SUB1 on the fourth to seventh lower conductive patterns BML4, BLM5, BML6, and BML7. The buffer layer BUF may be disposed to cover the fourth to seventh lower conductive patterns BML4, BML5, BML6, and BML7. The buffer layer BUF may include an inorganic insulating material. Examples of the inorganic insulating material may include silicon oxide ($SiO_x$), silicon nitride ($SiN_x$), silicon oxynitride ($SiO_xN_y$), and the like. These may be used individually or in combination.

The fifth to eighth active patterns ACT5, ACT6, ACT7 and ACT8 may be disposed on the buffer layer BUF In the embodiments, the fifth to eighth active patterns ACT5, ACT6, ACT7, and ACT8 may, include a silicon semiconductor. Examples of the silicon semiconductor may include amorphous silicon and polycrystalline silicon. Alternatively, in the embodiments, the fifth to eighth active patterns ACT5, ACT6, ACT7, and ACT8 may include an oxide semiconductor. Examples of the oxide semiconductor may include indium-gallium-zinc oxide (IGZO), indium-gallium oxide (IGO), and indium-zinc oxide (IZO).

The gate insulating layer GI may be disposed on the buffer layer BUF on the fifth to eighth active patterns ACT5, ACT6, ACT7, and ACT8. The gate insulating layer GI may be disposed to cover the fifth to eighth active patterns ACT5, ACT6, ACT7, and ACT8. The gate insulating layer GI may include an inorganic insulating material. Examples of the inorganic insulating material may include silicon oxide ($SiO_x$), silicon nitride ($SiN_x$), silicon oxynitride ($SiO_xN_y$), and the like. These may be used individually or in combination.

The seventh to tenth gate patterns GE7, GE8, GE9, and GE10 may be disposed on the gate insulating layer GI. Signals and/or voltages may flow through the fifth to eighth active patterns ACT5, ACT6, ACT7, and ACT8 in response to a gate signal provided to the seventh to tenth gate patterns GE7, GE8, GE9, and GE10. The seventh gate pattern GE7 may form the third capacitor CST3 with the fourth lower conductive pattern BML4. The eighth gate pattern GE8 may form the first capacitor CST1 with the fifth lower conductive pattern BML5. The tenth gate pattern GE10 may form the fourth capacitor CST4 with the seventh lower conductive pattern BML7. The ninth gate pattern GE9 may form the second capacitor CST2 with the sixth lower conductive pattern BML6, The seventh to tenth gate patterns GE7, GE8, GE9, and GE10 may include metal, metal oxide, metal nitride, and the like. Examples of the metal may include silver molybdenum, aluminum, tungsten (W), copper (Cu), nickel (Ni), chromium (Cr), titanium (Ti), tantalum (Ta), platinum (Pt), and scandium (Sc). These may be used individually or in combination, Examples of the metal oxide may include indium tin oxide (ITO), and indium zinc oxide (IZO)) These may be used individually or in combination. Examples of the metal nitride may include aluminum nitride (AlN), tungsten nitride (WN), and chromium nitride (CrN). These may be used individually or in combination.

The interlayer insulating layer ILD may be disposed on the gate insulating layer GI on the seventh to tenth gate patterns GE7, GE8, GE9, and GE10. The interlayer insulating layer ILD may be disposed to cover the seventh to tenth gate patterns GE7, GE8, GE9, and GE10. The interlayer insulating layer ILD may include an inorganic insulating material. Examples of the inorganic insulating material may include silicon oxide ($SiO_x$), silicon nitride ($SiN_x$), silicon oxynitride ($SiO_xN_y$), and the like. These may be used individually or in combination.

The sixth upper conductive pattern CE6, the ninth upper conductive pattern CE9, and the tenth to fifteenth upper conductive patterns CE10, CE11, CE12, CE13. CE14, and CE15 may be disposed on the interlayer insulating layer ILD. Each of the sixth upper conductive pattern CE6 and the ninth upper conductive pattern CE9 may be electrically connected to the fifth active pattern ACT5. The ninth upper conductive pattern CE9 may also be electrically connected to the fourth lower conductive pattern BML4. Each of the tenth upper conductive pattern CE10 and the eleventh upper conductive pattern CE11 may be electrically connected to the sixth active pattern ACT6. The tenth upper conductive pattern CE10 may also be electrically connected to the fifth lower conductive pattern BML5. Each of the twelfth upper conductive pattern CE12 and the thirteenth upper conductive pattern CE13 may be electrically connected to the seventh active pattern ACT7. The twelfth upper conductive pattern CE12 may also be electrically connected to the sixth lower conductive pattern BML6. Each of the fourteenth upper conductive pattern CE14 and the fifteenth upper conductive pattern CE15 may be electrically connected to the eighth active pattern ACT8. The fourteenth upper conductive pattern CE14 may also be electrically connected to the seventh lower conductive pattern BML7.

Each of the sixth upper conductive pattern CE6, the ninth upper conductive pattern CE9, and the tenth to fifteenth upper conductive patterns CE10, CE11, CE12, CE13, CE14, and CE15 may include metal, metal oxide, metal nitride, and the like. Examples of the metal may include silver, molybdenum, aluminum, tungsten (W), copper (Cu), nickel (Ni), chromium (Cr), titanium (Ti), tantalum (Ta), platinum (Pt), and scandium (Sc). These may be used individually or in combination. Examples of the metal oxide may include indium tin oxide (ITO), and indium zinc oxide (IZO). These may be used individually or in combination. Examples of the metal nitride may include aluminum nitride (AlN), tungsten nitride (WN), and chromium nitride (CrN). These may be used individually or in combination.

The via insulating layer VIA may be disposed on the interlayer insulating layer ILD on the sixth upper conductive pattern CE6, the ninth upper conductive pattern CE9, and the tenth to fifteenth upper conductive patterns CE1.0, CE11 CE12, CE13, CE14, and CE15. The via insulating layer VIA may be disposed to covet the sixth upper conductive pattern CE6, the ninth upper conductive pattern CE9, and the tenth to fifteenth upper conductive patterns CE10, CE11, CE12, CE13, CE14, and CE15. The via insulating layer VIA may have a substantially flat top surface. The via insulating layer VIA may include an organic insulating material. Examples of the organic insulating material may include photoresist, polyacrylic-based resin, polyimide-based resin, and acrylic resin. These may be used individually or in combination.

The first to fourth anode patterns AD1, AD2, AD3, and AD4 may be disposed on the via insulating layer VIA. The first anode pattern AD1 may be electrically connected to the tenth upper conductive pattern CE10, the second anode pattern AD2 may be electrically connected to the twelfth upper conductive pattern CE12, the third anode pattern. AD3 may be electrically connected to the ninth upper conductive pattern CE9, and the fourth anode pattern AD4 may be electrically connected to the fourteenth upper conductive pattern CE14. The first to fourth anode patterns AD1, AD2, AD3, and AD4 may include metal, metal oxide, metal nitride, and the like. Examples of the metal may include silver, molybdenum, aluminum, tungsten (W), copper (Cu), nickel (Ni), chromium (Cr), titanium (Ti), tantalum (Ta), platinum (Pt), and scandium (Sc). These may be used individually or in combination. Examples of the metal oxide may include indium tin oxide (ITO), and indium zinc oxide (ILO). These may be used individually or in combination. Examples of the metal nitride may include aluminum nitride (AlN), tungsten nitride (WN), and chromium nitride (CrN). These may be used individually or in combination.

The pixel defining layer PDL may be disposed on the via insulating layer VIA on the first to fourth anode patterns AD1, AD2, AD3, and AD4. Openings exposing each of the first to fourth anode patterns AD1, AD2, AD3, and AD4 may be formed in the pixel defining layer PDL. The pixel defining layer PDL may include an organic insulating material.

The intermediate layer EL may be disposed on the first to fourth anode patterns AD1, AD2, AD3, and AD4 and the pixel defining layer PDL. The intermediate layer EL may an organic material that emits light of a preset color. For example, all of the intermediate layers EL may include an organic material for emitting blue light. Each of the intermediate layers EL may have a structure in which a plurality of blue organic light emitting layers are laminated. For example, each of the intermediate layers EL may have a structure in which three blue organic light emitting layers are laminated.

Alternatively, each of the intermediate layers EL may have a structure in which a plurality of blue organic light emitting layers and organic light emitting layers emitting light having different colors are laminated. For example, each of the intermediate layers EL may have a structure in which three blue organic light emitting layers and one green organic light emitting layer are laminated.

However, in the embodiments, the intermediate layer EL may also be disposed to overlap only the respective anode patterns AD1, AD2, AD3, AD4.

The cathode electrode CATH may be disposed on the intermediate layer EL. The cathode electrode CATH may include metal, metal oxide, metal nitride, and the like. Examples of the metal may include silver, molybdenum, aluminum, tungsten (W), copper (Cu), nickel (Ni), chromium (Cr), titanium (Ti), tantalum (Ta), platinum (Pt), and scandium (Sc). These may be used individually or in combination. Examples of the metal oxide may include indium tin oxide (ITO), and indium zinc oxide (IZO). These may be used individually or in combination. Examples of the metal nitride may include aluminum nitride (MN), tungsten nitride (WN), and chromium nitride (CrN). These may be used individually or in combination.

The encapsulation layer ENC may be disposed on the cathode electrode CATH. The encapsulation layer ENC may have a laminated structure of an inorganic layer/organic layer/inorganic layer. The encapsulation layer ENC may serve to protect the first to fourth light emitting diodes ED1, ED2, ED3, and ED4 from external impacts and materials. The encapsulation layer ENC may be disposed to have a substantially flat top surface.

The second substrate SUB2 may include glass. Accordingly, the second substrate SUB2 may have rigidity. Alternatively, the second substrate SUB2 may have flexibility when fabricated or patterned at a certain thickness or below.

First to third color filters CF1, CF2, and CF3 may be disposed on the second substrate SUB2. The first to third color filters CF1, CF2 and CF3 may filter the light emitted from below to allow only light having a desired color to be emitted to the outside of the display device DD. The first to third color filters CF1, CF2, and CF3 may be disposed to partially overlap each other. In this case, the first to third color filters CF1, CF2 and CF3 overlapped one another may block the light emitted from the below from being emitted to the outside. For example, a blocking region OLA may have the overlapping first to third color filters CF1 CF2, and CF3, so that light L emitted from the below may not be emitted to the outside. Accordingly, the display device DD may allow light of a desired color to be emitted through desired area.

In the embodiments, the same third color filter CF3 may be overlapped on the third light emitting diode ED3 and the fourth light emitting diode ED4 that have relatively small areas. For example, the third color filter CF3 may be a green color filter that transmits green light.

The refractive layer LR may be disposed on the first to third color filters CF1, CF2, and CF3. The refractive layer LR may adjust a light path of the light L emitted from the below. For example, the refractive layer LR may change a path of light in an obliquely incident direction into a direction perpendicular to the second substrate SUB2. The refractive layer LR may include a polymeric material and a silica-based material.

The first protective layer PLT1 may be disposed on the refractive layer LR. The first protective layer PLT1 may include an inorganic insulating material. The first protective layer PLT1 may serve to protect the refractive layer LR. Examples of the inorganic insulating material may include silicon oxide ($SiO_x$), silicon nitride ($SiN_x$), silicon oxynitride ($SiO_xN_y$), and the like. These may be used individually or in combination.

The bank layer BK, first and second color conversion layers QD1 and QD2, and a light transmitting layer QD3 may be disposed on the first protective layer PTL1. The first and second color conversion layers QD1 and QD2 and the light transmitting layer QD3 may be partitioned from each other by the bank layer BK. The bank layer BK may be disposed to overlap the pixel defining layer PDL, The bank layer BK may include an organic insulating material. The first and second color conversion layers QD1 and QD2 may convert the color of the light L emitted from the first, third, and fourth light emitting diodes ED1, ED3, and ED4. For example, all of the first, third and fourth light emitting diodes ED1, ED3, and ED4 may emit blue light. The first color conversion layer QD1 may convert the blue light into red light, and the second color conversion layer QD2 may convert the blue light into green light. The light transmitting layer QD3 may transmit the blue light emitted from the second light emitting diode ED2.

The second protective layer PTL2 may be disposed to cover the bank layer BK, the first and second color conversion layers QD1 and QD2, and the light transmitting layer QD3. Accordingly, the second protective layer PTL2 may protect the bank layer BK, the first and second color conversion layers QD1 and QD2, and the light transmitting layer QD3. The second protective layer PTL2 may include an inorganic insulating material. Examples of the inorganic insulating material may include silicon oxide ($SiO_x$), silicon nitride ($SiN_x$), silicon oxynitride ($SiO_xN_y$), and the like. These may be used individually or in combination.

Figure 17:
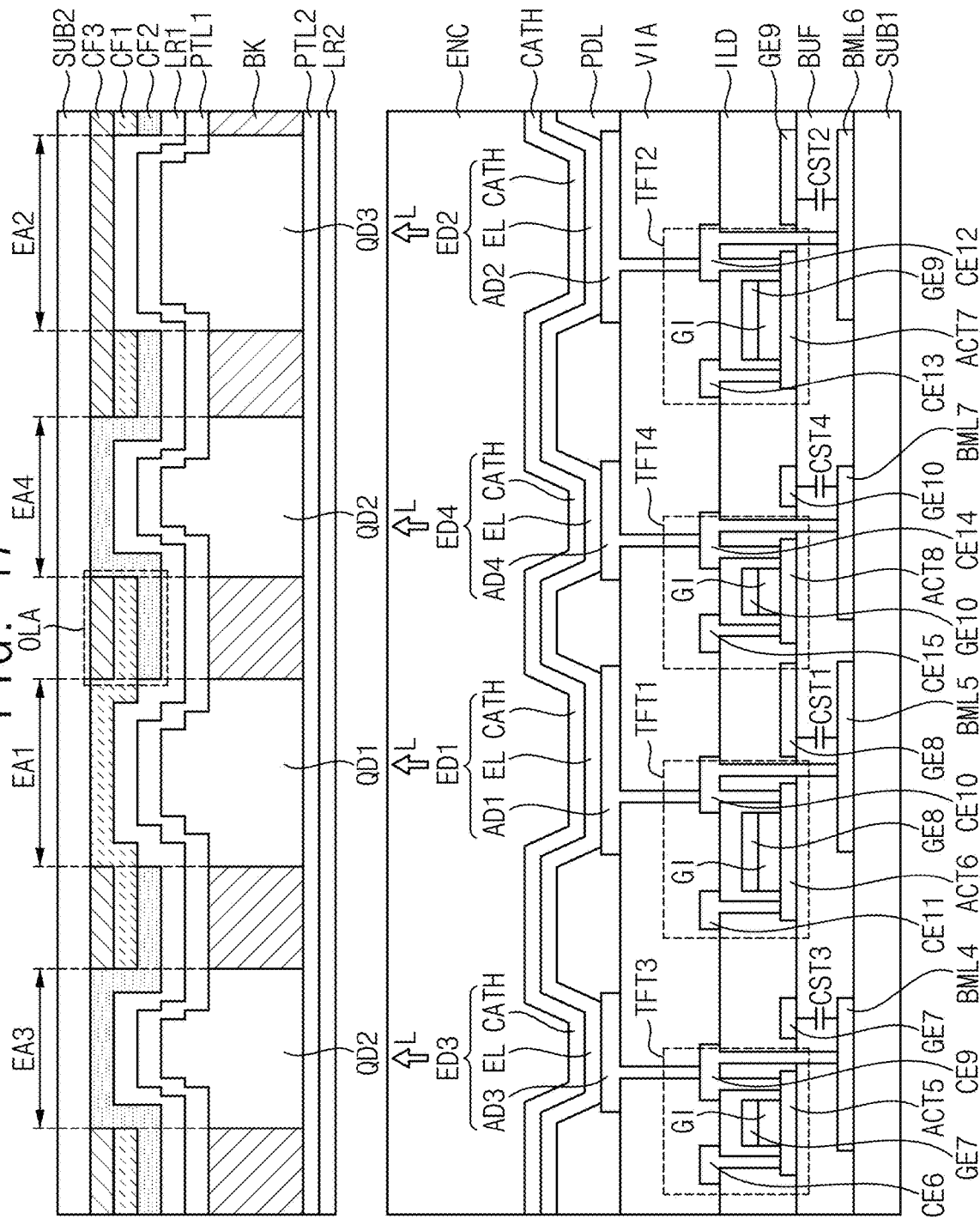
FIG. 17 is a sectional view schematically showing another embodiment taken along the line I-I' of FIG. 1.

FIG. 17 is a sectional view schematically showing another embodiment taken along the line I-I' of FIG. 1. FIG. 17 may be substantially the same as FIG. 16, except that two refractive layers LR1 and LR2 are disposed. Accordingly, the description for duplicate components will be omitted.

Referring to FIGS. 1 and 17, the display device DD may include a first refractive layer LR1 and a second refractive layer LR2. The first refractive layer LR1 may be disposed in the same manner as the refractive layer LR of FIG. 16, and the second refractive layer LR2 may be disposed under the second protective layer PTL2. The second refractive layer LR2 may perform substantially the same role as the first refractive layer LR1.

Figure 18:
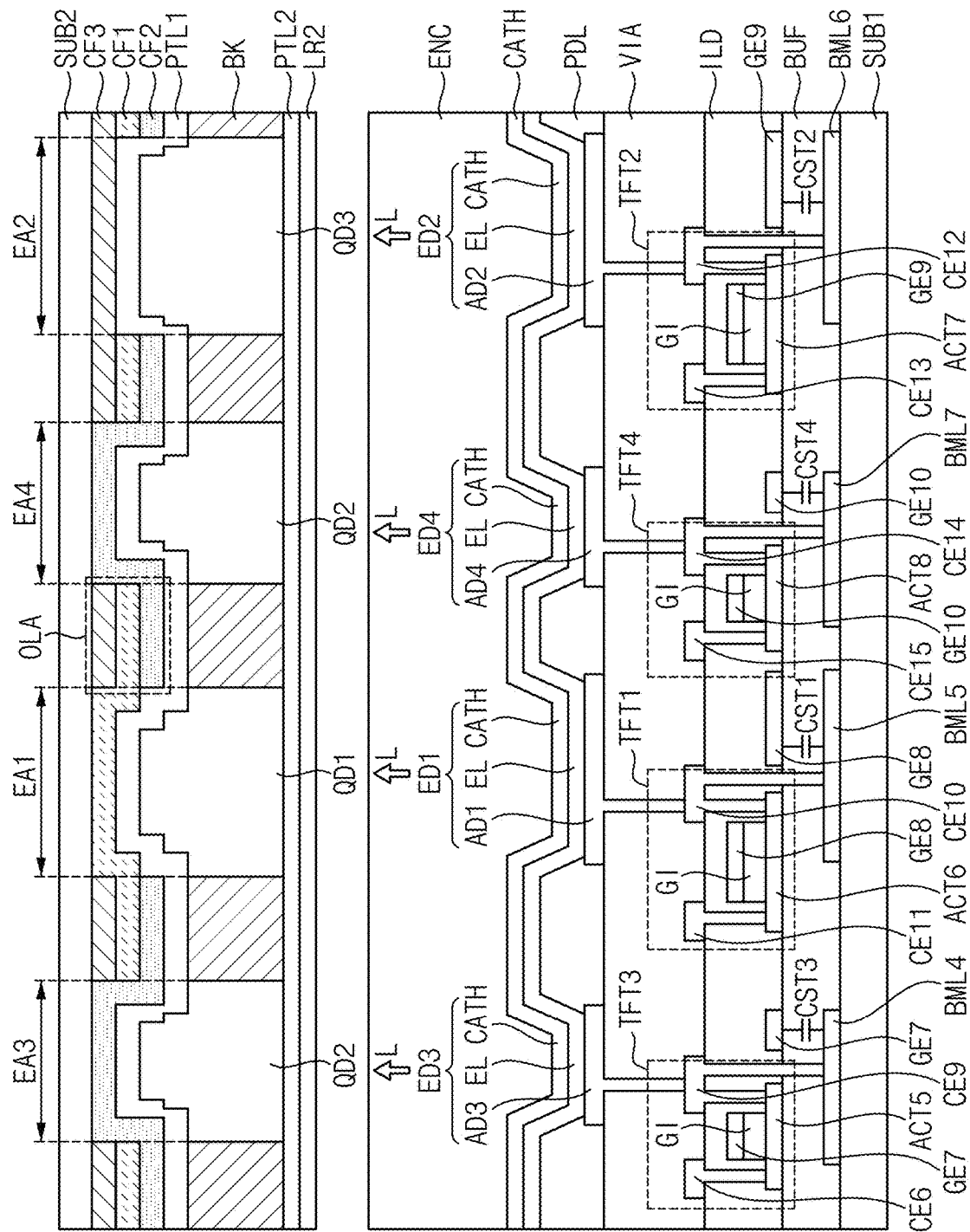

FIG. 18 is a sectional view schematically showing still another embodiment taken along the line I-I' of FIG. 1. FIG. 18 may be substantially the same as FIG. 17, except that the first refractive layer LR1 is not disposed. Accordingly, the description for duplicate components will be omitted, FIG. 19 is a sectional view schematically showing still another embodiment taken along the line I-I' of FIG. 1, FIG.

19 may be substantially the same as FIG. 16, except that a passivation layer PVX is disposed between the interlayer insulating layer ILD and the via insulating layer VIA. Accordingly, the description for duplicate components will be omitted.

Figure 19:
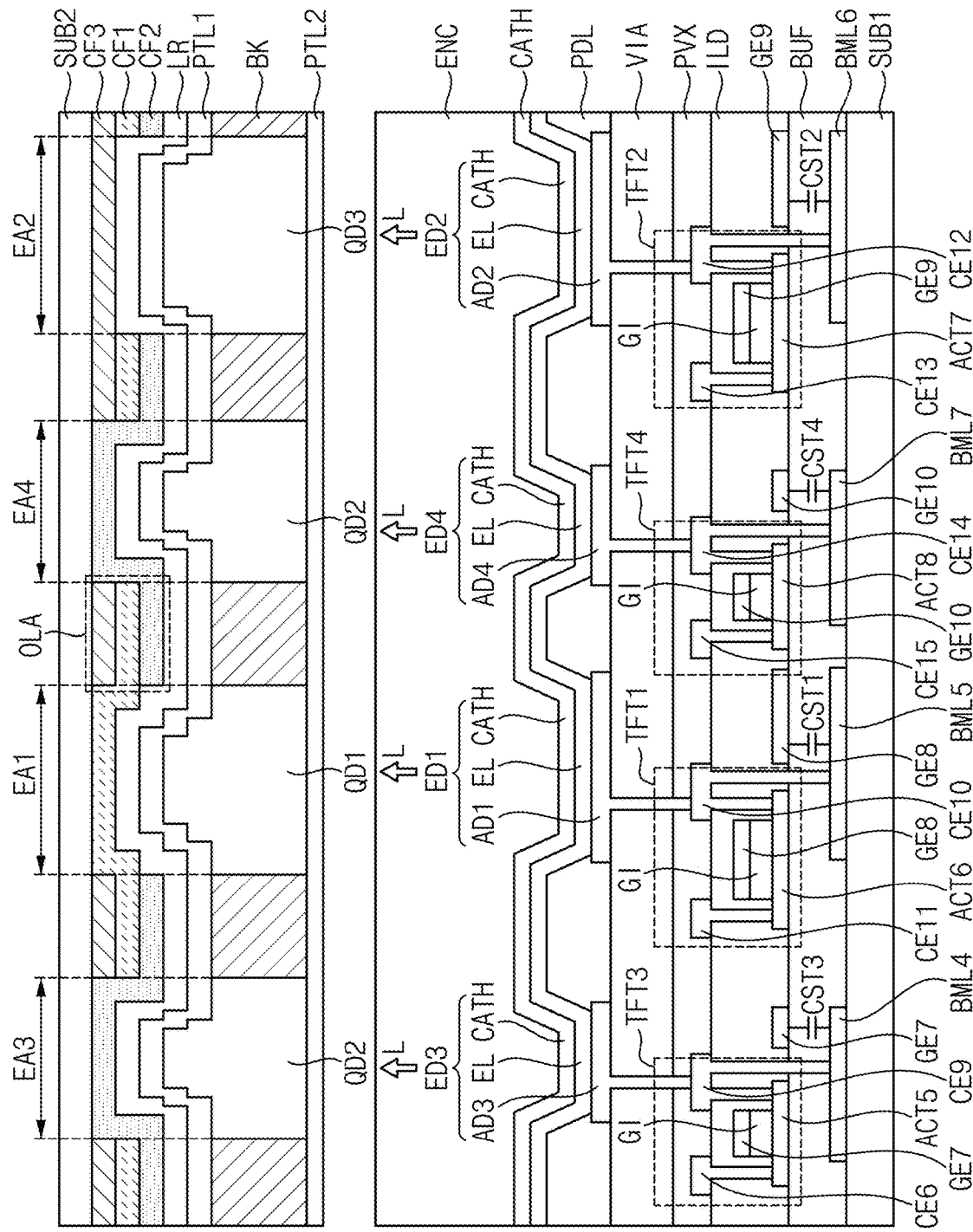
FIG. 19 is a sectional view schematically showing still another embodiment taken along the line I-I' of FIG. 1.

Referring to FIGS. 1 and 19, the passivation layer PVX may be disposed to cover the sixth upper conductive pattern CE6, the ninth upper conductive pattern CE9, and the tenth to fifteenth upper conductive patterns CE10, CE11, CE12, CE13, CE14, and CE15. The passivation layer PVX may include an inorganic insulating material. Examples of the inorganic insulating material may include silicon oxide ($SiO_x$), silicon nitride ($SiN_x$), silicon oxynitride ($SiO_xN_y$), and the like. These may be used individually or in combination.

Figure 20:
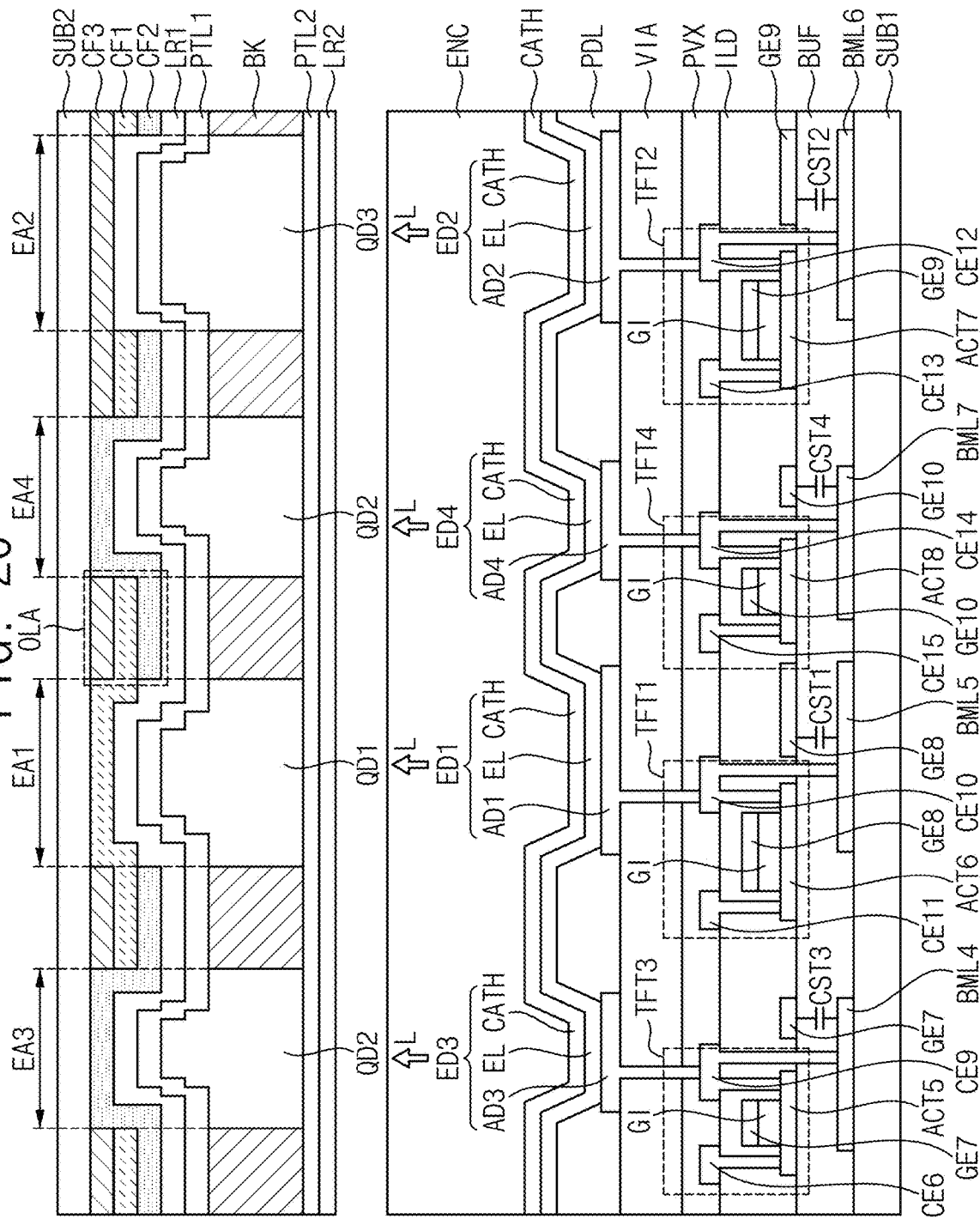
FIG. 20 is a sectional view schematically showing still another embodiment taken along the line I-I' of FIG. 1.

FIG. 20 is a sectional view schematically showing still another embodiment taken along the line I-I' of FIG. 1. FIG. 20 may be substantially the same as FIG. 17, except that the passivation layer PVX is added. Accordingly, the description for duplicate components will be omitted.

Figure 21:
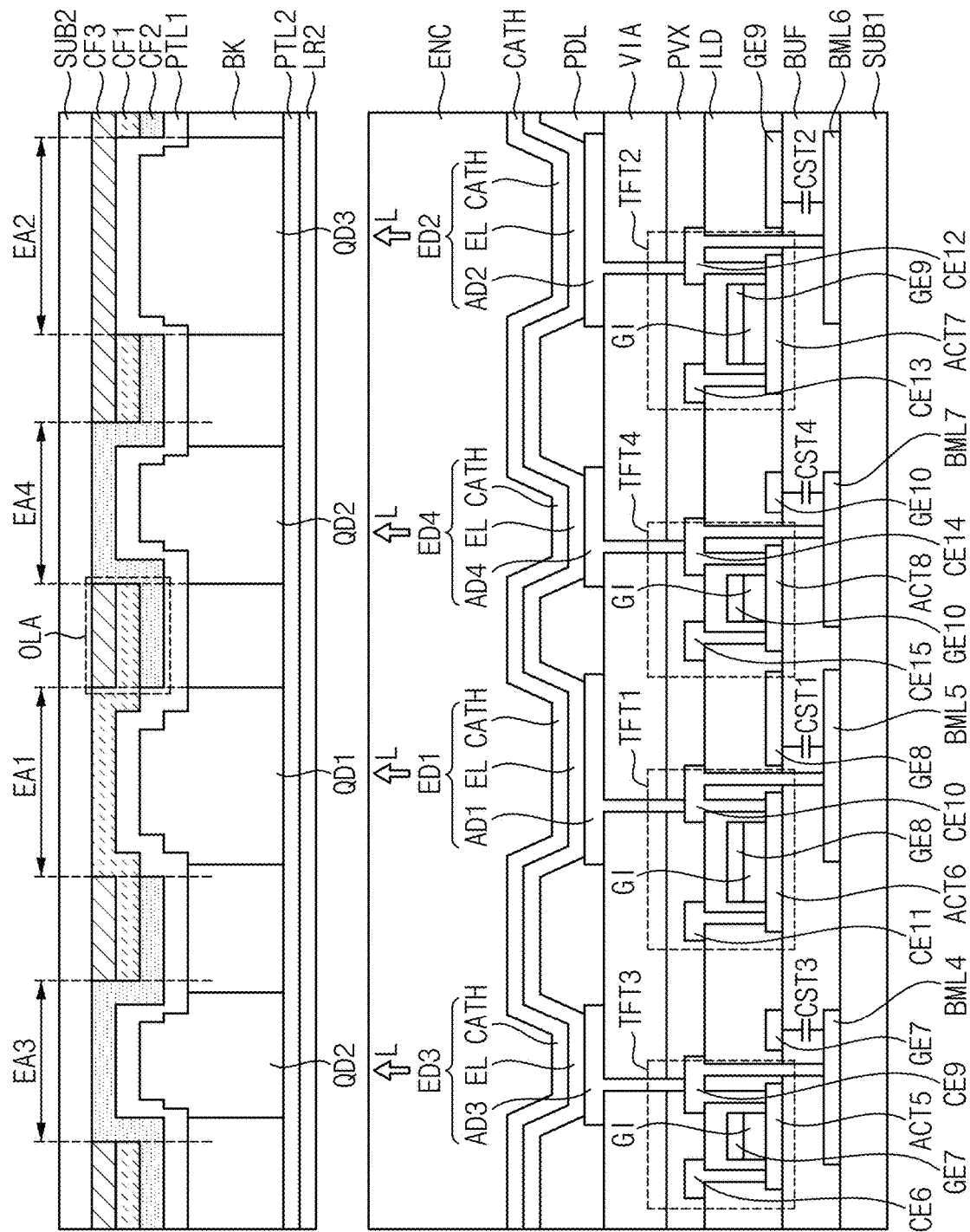
FIG. 21 is a sectional view schematically showing still another embodiment taken along the line I-I' of FIG. 1.
Figure 22:
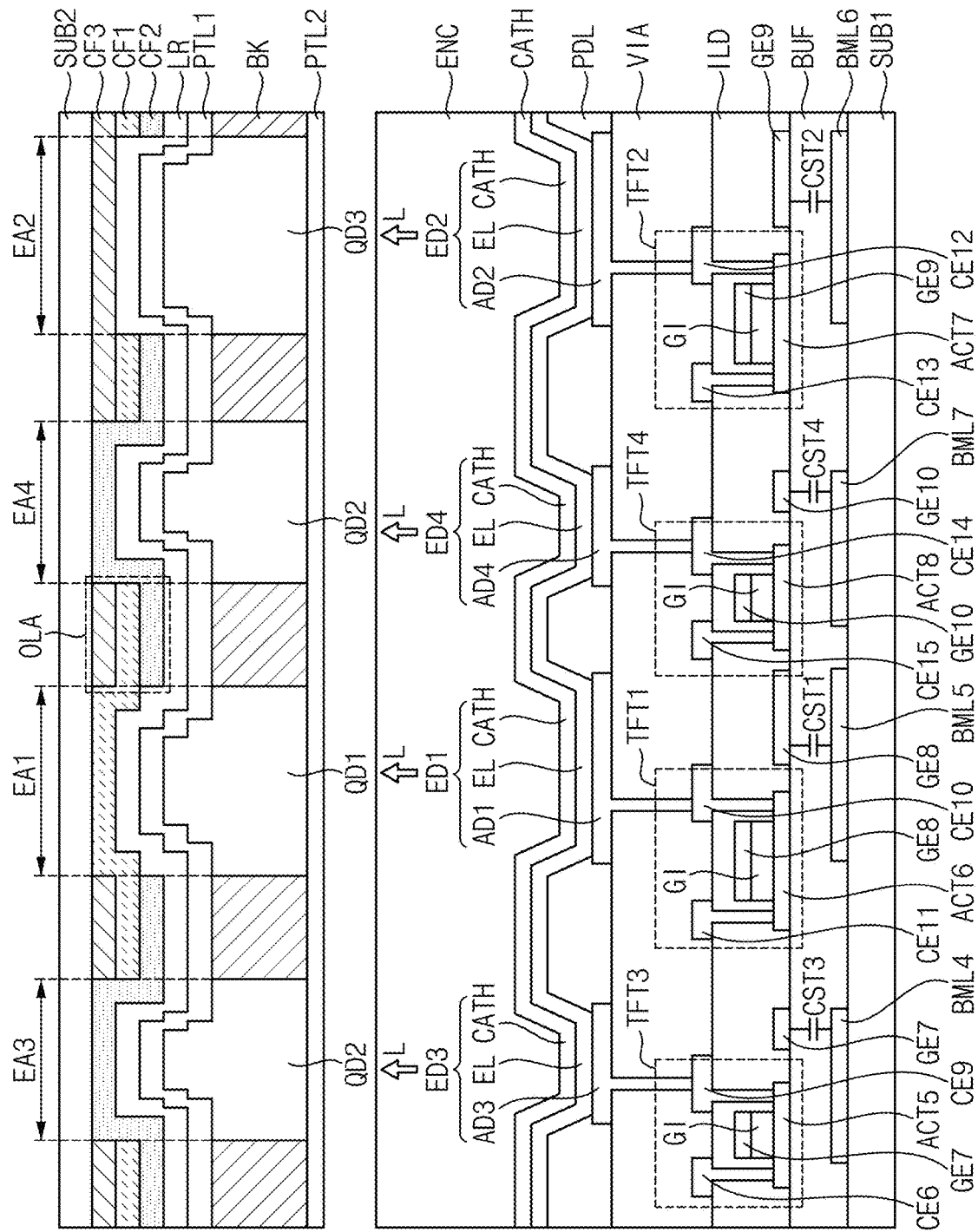
FIGS. 22 and 23 are sectional views schematically showing still another embodiment taken along the line I-I' of FIG. 1.
Figure 23:
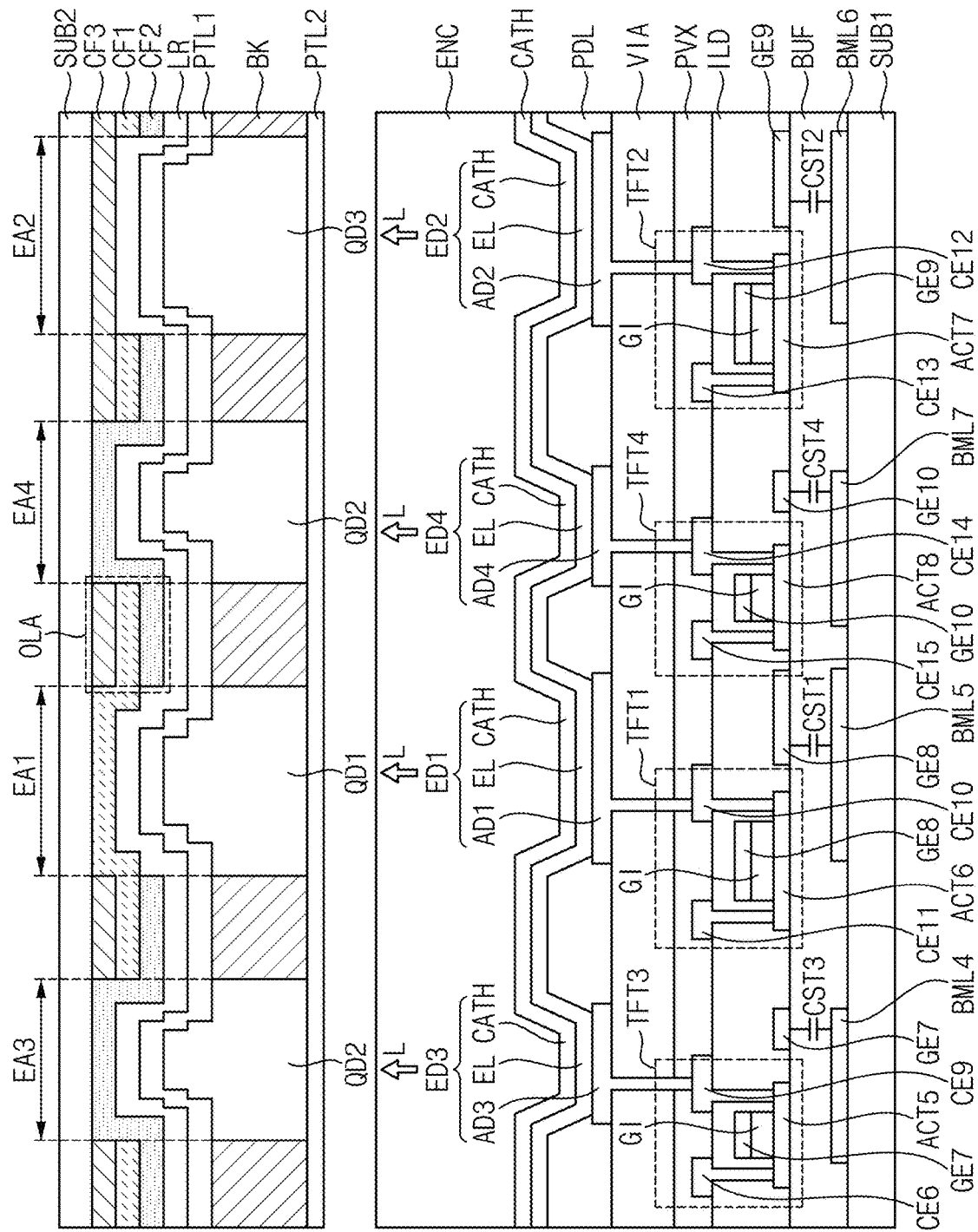

FIG. 21 is a sectional view schematically showing still another embodiment taken along the line I-I' of FIG. 1, FIG. 21 may be substantially the same as FIG. 18, except that the passivation layer PVX is added. Accordingly, the description for duplicate components will be omitted, FIGS. 22 and 23 are sectional views schematically showing still another embodiment taken along the line I-I' of FIG. 1, FIG. 22 may be substantially the same as FIG. 16, except that the fourth to seventh lower conductive patterns BML4, BML5, BML6, and BML7 are not connected to the ninth, tenth, twelfth, and fourteenth upper conductive patterns CE9, CE10, CE12, and CE141. In addition, FIG. 23 may be substantially the same as FIG. 19, except that the fourth to seventh lower conductive patterns BLM4, BLM5, BML6, and BLM7 are not connected to the ninth, tenth, twelfth, and fourteenth upper conductive patterns CE9, CE1), CE12, and CE14. Accordingly, the description for duplicate components will be omitted.

The present inventive concept may be applied to a pixel and a display device including the same. For example, the present inventive concept may be applied to high-resolution smartphones, mobile phones, smart pads, smart watches, tablet PCs, vehicle navigation systems, televisions, computer monitors, notebook computers, and the like.

Although it has been described with reference to exemplary embodiments of the present inventive concept, it will be apparent to a person having ordinary skill in the art that various modifications and variations can be made in the present inventive concept without departing from the scope and field of the following appended

What is claimed is:

1. A pixel comprising:
first to fourth driving transistors;
a first switching transistor including a first active pattern and electrically connected to the first driving transistor;
a second switching transistor including a second active pattern and electrically connected to the second driving transistor;
a first light emitting diode connected to the first driving transistor;
a second light emitting diode connected to the second driving transistor and spaced apart from the first light emitting diode in a first direction when viewed in a plan view;
a third light emitting diode connected to the third driving transistor and disposed between the first light emitting diode and the second light emitting diode when viewed in a plan view; and
a fourth light emitting diode connected to the fourth driving transistor and disposed between the first light emitting diode and the second light emitting diode when viewed in a plan view,
wherein a planar area of the first driving transistor is smaller than a planar area of each of the third driving transistor and the fourth driving transistor, a planar area of the second driving transistor is smaller than the planar area of the each of the third driving transistor and the fourth driving transistor, a first data signal is applied to the first driving transistor and the second driving transistor, a second data signal different from the first data signal is applied to the third driving transistor, and a third data signal different from the first data signal and the second data signal is applied to the fourth driving transistor, and
wherein the first switching transistor and the second switching transistor are connected to a same gate pattern to which a scan signal is applied.

2. The pixel of claim 1, wherein the planar area of the first driving transistor is less than or equal to a half of the planar area of the each of the third driving transistor and the fourth driving transistor, and the planar area of the second driving transistor is less than or equal to a half of the planar area of the each of the third driving transistor and the fourth driving transistor.

3. The pixel of claim 1, wherein a planar area of the first light emitting diode is smaller than a planar area of each of the third light emitting diode and the fourth light emitting diode, and a planar area of the second light emitting diode is smaller than the planar area of the each of the third light emitting diode and the fourth light emitting diode.

4. The pixel of claim 3, wherein the planar area of the first light emitting diode is less than or equal to a half of the planar area of the each of the third light emitting diode and the fourth light emitting diode, and the planar area of the second light emitting diode is less than or equal to a half of the planar area of the each of the third light emitting diode and the fourth light emitting diode.

5. The pixel of claim 4, further comprising:
a first capacitor connected to the first driving transistor;
a second capacitor connected to the second driving transistor;
a third capacitor connected to the third driving transistor; and
a fourth capacitor connected to the fourth driving transistor,
wherein a planar area of the first capacitor is less than or equal to a half of a planar area of each of the third capacitor and the fourth capacitor, and a planar area of the second capacitor is less than or equal to a half of the planar area of the each of the third capacitor and the fourth capacitor.

6. The pixel of claim 1, further comprising:
a first capacitor connected to the first driving transistor;
a second capacitor connected to the second driving transistor;
a third capacitor connected to the third driving transistor; and
a fourth capacitor connected to the fourth driving transistor,
wherein a planar area of the first capacitor is less than or equal to a half of a planar area of each of the third capacitor and the fourth capacitor, and a planar area of the second capacitor is less than or equal to a half of the planar area of the each of the third capacitor and the fourth capacitor.

7. The pixel of claim 1, wherein, when viewed in a planar view, the third light emitting diode and the fourth light emitting diode are spaced apart from each other in a second direction perpendicular to the first direction.

8. The pixel of claim 7, wherein the first light emitting diode and the second light emitting diode partially overlap the third light emitting diode and the fourth light emitting diode in the first direction.

9. The pixel of claim 7, wherein the first light emitting diode and the second light emitting diode partially overlap the third light emitting diode and the fourth light emitting diode in the second direction.

10. The pixel of claim 7, wherein the first light emitting diode and the second light emitting diode partially overlap the third light emitting diode and the fourth light emitting diode in the first direction and the second direction.

11. A display device comprising:
a substrate;
first to fourth driving transistors;
a first switching transistor including a first active pattern and electrically connected to the first driving transistor;
a second switching transistor including a second active pattern and electrically connected to the second driving transistor;
a first light emitting diode connected to the first driving transistor;
a second light emitting diode connected to the second driving transistor and spaced apart from the first light emitting diode in a first direction when viewed in a plan view;
a third light emitting diode connected to the third driving transistor and disposed between the first light emitting diode and the second light emitting diode when viewed in a plan view;
a fourth light emitting diode connected to the fourth driving transistor and disposed between the first light emitting diode and the second light emitting diode when viewed in a plan view; and
an encapsulation layer disposed on the first to fourth light emitting diodes to cover the first to fourth light emitting diodes,
wherein a planar area of the first driving transistor is smaller than a planar area of each of the third driving transistor and the fourth driving transistor, a planar area of the second driving transistor is smaller than the planar area of the each of the third driving transistor and the fourth driving transistor, a first data signal is applied to the first driving transistor and the second driving transistor, a second data signal different from the first data signal is applied to the third driving transistor, and a third data signal different from the first data signal and the second data signal is applied to the fourth driving transistor, and
wherein the first switching transistor and the second switching transistor are connected to a same gate pattern to which a scan signal is applied.

12. The display device of claim 11, wherein the planar area of the first driving transistor is less than or equal to a half of the planar area of the each of the third driving transistor and the fourth driving transistor, and the planar area of the second driving transistor is less than or equal to a half of the planar area of the each of the third driving transistor and the fourth driving transistor.

13. The display device of claim 11, wherein a planar area of the first light emitting diode is smaller than a planar area of each of the third light emitting diode and the fourth light emitting diode, and a planar area of the second light emitting diode is smaller than the planar area of the each of the third light emitting diode and the fourth light emitting diode.

14. The display device of claim 13, wherein the planar area of the first light emitting diode is less than or equal to a half of the planar area of the each of the third light emitting diode and the fourth light emitting diode, and the planar area of the second light emitting diode is less than or equal to a half of the planar area of the each of the third light emitting diode and the fourth light emitting diode.

15. The display device of claim 14, further comprising:
a first capacitor connected to the first driving transistor;
a second capacitor connected to the second driving transistor;
a third capacitor connected to the third driving transistor; and
a fourth capacitor connected to the fourth driving transistor,
wherein a planar area of the first capacitor is less than or equal to a half of a planar area of each of the third capacitor and the fourth capacitor, and a planar area of the second capacitor is less than or equal to a half of the planar area of the each of the third capacitor and the fourth capacitor.

16. The display device of claim 11, further comprising:
a first capacitor connected to the first driving transistor;
a second capacitor connected to the second driving transistor;
a third capacitor connected to the third driving transistor; and
a fourth capacitor connected to the fourth driving transistor,
wherein a planar area of the first capacitor is less than or equal to a half of a planar area of each of the third capacitor and the fourth capacitor, and a planar area of the second capacitor is less than or equal to a half of the planar area of the each of the third capacitor and the fourth capacitor.

17. The display device of claim 11, wherein, when viewed in a planar view, the third light emitting diode and the fourth light emitting diode are spaced apart from each other in a second direction perpendicular to the first direction.

18. The display device of claim 17, wherein the first light emitting diode and the second light emitting diode partially overlap the third light emitting diode and the fourth light emitting diode in the first direction.

19. The display device of claim 17, wherein the first light emitting diode and the second light emitting diode partially overlap the third light emitting diode and the fourth light emitting diode in the second direction.

20. The display device of claim 17, wherein the first light emitting diode and the second light emitting diode partially overlap the third light emitting diode and the fourth light emitting diode in the first direction and the second direction.

21. The display device of claim 11, further comprising:
a first color conversion layer disposed on the first light emitting diode to overlap the first light emitting diode and converting light emitted from the first light emitting diode into first light having a first color;
a second color conversion layer disposed on the second light emitting diode to overlap the second light emitting diode and converting light emitted from the second light emitting diode into second light having the first color;

a third color conversion layer disposed on the third light emitting diode to overlap the third light emitting diode and converting light emitted from the third light emitting diode into third light having a second color different from the first color; and a light transmitting layer disposed on the fourth light emitting diode to overlap the fourth light emitting diode and transmitting light emitted from the fourth light emitting diode.

22. The display device of claim 21, further comprising:

a first color filter disposed on the first color conversion layer and the second color conversion layer to overlap each of the first color conversion layer and the second color conversion layer;

a second color filter disposed on the third color conversion layer to overlap the third color conversion layer; and a third color filter disposed on the light transmitting layer to overlap the light transmitting layer.

* * * * *